(12) United States Patent
Choi et al.

(10) Patent No.: US 12,431,474 B2
(45) Date of Patent: Sep. 30, 2025

(54) SEMICONDUCTOR PACKAGE

(71) Applicant: SAMSUNG ELECTRONICS CO., LTD., Suwon-si (KR)

(72) Inventors: Ju-Il Choi, Seongnam-si (KR); Un-Byoung Kang, Hwaseong-si (KR); Minseung Yoon, Yongin-si (KR); Yonghoe Cho, Cheonan-si (KR); Jeonggi Jin, Seoul (KR); Yun Seok Choi, Hwaseong-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 557 days.

(21) Appl. No.: 17/851,245

(22) Filed: Jun. 28, 2022

(65) Prior Publication Data

US 2023/0111854 A1   Apr. 13, 2023

(30) Foreign Application Priority Data

Oct. 13, 2021  (KR) .................. 10-2021-0136118

(51) Int. Cl.
*H01L 23/538* (2006.01)
*H01L 23/00* (2006.01)
(Continued)

(52) U.S. Cl.
CPC ........ *H01L 25/105* (2013.01); *H01L 23/3128* (2013.01); *H01L 23/481* (2013.01); *H01L 23/49811* (2013.01); *H01L 23/5383* (2013.01); *H01L 23/5385* (2013.01); *H01L 24/16* (2013.01); *H01L 24/32* (2013.01); *H01L 24/73* (2013.01); *H01L 24/13* (2013.01); *H01L 24/29* (2013.01); *H01L 2224/05624* (2013.01); *H01L 2224/05647* (2013.01); *H01L 2224/05666* (2013.01); *H01L 2224/05684* (2013.01);
(Continued)

(58) Field of Classification Search
None
See application file for complete search history.

(56) References Cited

U.S. PATENT DOCUMENTS 8,884,431 B2   11/2014 Lin et al.
9,589,936 B2   3/2017 Zhai et al.
(Continued)

FOREIGN PATENT DOCUMENTS

CN   111354647 A   6/2020

*Primary Examiner* — Xiaoming Liu
(74) *Attorney, Agent, or Firm* — Sughrue Mion, PLLC

(57) ABSTRACT

Provided is a semiconductor package, including a first redistribution substrate, a first semiconductor chip on the first redistribution substrate, first bumps between the first redistribution substrate and the first semiconductor chip, a conductive structure on the first redistribution substrate and spaced apart from the first semiconductor chip, a second redistribution substrate on the first semiconductor chip, second bumps between the first semiconductor chip and the second redistribution substrate, a second semiconductor chip on the second redistribution substrate, a first mold layer between the first redistribution substrate and the second redistribution substrate, and on the first semiconductor chip, and a second mold layer on the second redistribution substrate and the second semiconductor chip, and spaced apart from the first mold layer.

20 Claims, 22 Drawing Sheets

(51) Int. Cl.
 *H01L 23/31* (2006.01)
 *H01L 23/48* (2006.01)
 *H01L 23/498* (2006.01)
 *H01L 25/10* (2006.01)

(52) U.S. Cl.
 CPC ............ *H01L 2224/13111* (2013.01); *H01L 2224/13113* (2013.01); *H01L 2224/13116* (2013.01); *H01L 2224/13118* (2013.01); *H01L 2224/13124* (2013.01); *H01L 2224/13139* (2013.01); *H01L 2224/13144* (2013.01); *H01L 2224/13147* (2013.01); *H01L 2224/13155* (2013.01); *H01L 2224/16227* (2013.01); *H01L 2224/2929* (2013.01); *H01L 2224/29299* (2013.01); *H01L 2224/32225* (2013.01); *H01L 2224/73204* (2013.01)

(56) References Cited

U.S. PATENT DOCUMENTS

| | | |
|---|---|---|
| 9,806,063 B2 | 10/2017 | Kim et al. |
| 9,859,245 B1 | 1/2018 | Chen et al. |
| 10,535,597 B2 | 1/2020 | Chen et al. |
| 10,763,239 B2 | 9/2020 | Chen et al. |
| 11,011,502 B2 | 5/2021 | Lee |
| 2016/0013156 A1* | 1/2016 | Zhai .................. H01L 25/50 438/109 |
| 2019/0131273 A1* | 5/2019 | Chen .................. H01L 24/19 |
| 2020/0043853 A1* | 2/2020 | Kim .................. H01L 21/565 |
| 2020/0381346 A1* | 12/2020 | Chen .................. G01R 1/0433 |
| 2021/0020574 A1 | 1/2021 | Yu et al. |
| 2021/0066279 A1 | 3/2021 | Yu et al. |
| 2021/0118759 A1 | 4/2021 | Yu et al. |

\* cited by examiner

SEMICONDUCTOR PACKAGE

CROSS-REFERENCE TO RELATED APPLICATION

This application claims priority from Korean Patent Application No. 10-2021-0136118, filed on Oct. 13, 2021, in the Korean Intellectual Property Office, the disclosure of which is incorporated herein in its entirety by reference.

BACKGROUND

Example embodiments of the disclosure relate to a semiconductor package, and in particular, to a semiconductor package including a redistribution substrate.

A semiconductor package is configured to easily use a semiconductor chip as a part of an electronic product. In general, the semiconductor package includes a printed circuit board (PCB) and a semiconductor chip, which is mounted on the PCB and is electrically connected to the PCB by bonding wires or bumps. With the recent development of the electronics industry, various semiconductor package technologies are being developed with the goal of high reliability, miniaturization, high integration density, and small fabrication cost. In addition, as the use of this technology is expanded to various fields such as mass storage devices, various semiconductor packages are emerging.

SUMMARY

One or more embodiments provide a highly-integrated semiconductor package.

One or more embodiments also provide a semiconductor package that can be fabricated with a reduced cost.

According to an aspect of an example embodiment, there is provided a semiconductor package, including a first redistribution substrate, a first semiconductor chip on the first redistribution substrate, first bumps between the first redistribution substrate and the first semiconductor chip, a conductive structure on the first redistribution substrate, spaced apart from the first semiconductor chip, a second redistribution substrate on the first semiconductor chip, second bumps between the first semiconductor chip and the second redistribution substrate, a second semiconductor chip on the second redistribution substrate, a first mold layer between the first redistribution substrate and the second redistribution substrate, and on the first semiconductor chip, and a second mold layer, on the second redistribution substrate and the second semiconductor chip, spaced apart from the first mold layer.

According to another aspect of an example embodiment, there is provided a semiconductor package, including a first substrate, a first redistribution substrate on the first substrate, the first redistribution substrate including a first insulating layer and a first redistribution pattern in the first insulating layer, a first semiconductor chip on the first redistribution substrate, a first conductive structure, on the first redistribution substrate, spaced apart from the first semiconductor chip, a second redistribution substrate on the first semiconductor chip, the second redistribution substrate including a second insulating layer and a second redistribution pattern that is in the second insulating layer, a second semiconductor chip on the second redistribution substrate, and a second conductive structure on the first substrate and spaced apart from the first redistribution substrate, wherein the first redistribution pattern includes a first seed pattern and a first conductive pattern that is on the first seed pattern.

According to another aspect of an example embodiment, there is provided a semiconductor package, including a first substrate, a first redistribution substrate on the first substrate, a first semiconductor chip on the first redistribution substrate, a first conductive structure, on the first redistribution substrate, spaced apart from the first semiconductor chip, a second redistribution substrate on the first semiconductor chip, a second semiconductor chip on the second redistribution substrate, a second conductive structure, on the first substrate, spaced apart from the first redistribution substrate, a second substrate on the second semiconductor chip, and a first mold layer between the first redistribution substrate and the second redistribution substrate, and on the first semiconductor chip, wherein the first mold layer is between the first redistribution substrate and the first semiconductor chip and between the first semiconductor chip and the second redistribution substrate.

BRIEF DESCRIPTION OF THE DRAWINGS

The above and/or other aspects and features of the present disclosure will become more apparent by describing in detail example embodiments thereof with reference to the attached drawings, in which.

DETAILED DESCRIPTION

Hereinafter, embodiments will be explained in detail with reference to the accompanying drawings. Embodiments described herein are example embodiments, and thus, the disclosure is not limited thereto.

It will be understood that when an element or layer is referred to as being "over," "above," "on," "below" "under," "beneath," "connected to" or "coupled to" another element or layer, it can be directly over, above, on, below, under, beneath, connected or coupled to the other element or layer or intervening elements or layers may be present. In contrast, when an element is referred to as being "directly over," "directly above," "directly on," "directly below," "directly under," "directly beneath," "directly connected to" or "directly coupled to" another element or layer, there are no intervening elements or layers present. As used herein, expressions such as "at least one of," when preceding a list of elements, modify the entire list of elements and do not modify the individual elements of the list. For example, the expression, "at least one of a, b, and c," should be understood as including only a, only b, only c, both a and b, both a and c, both b and c, or all of a, b, and c.

Figure 1:
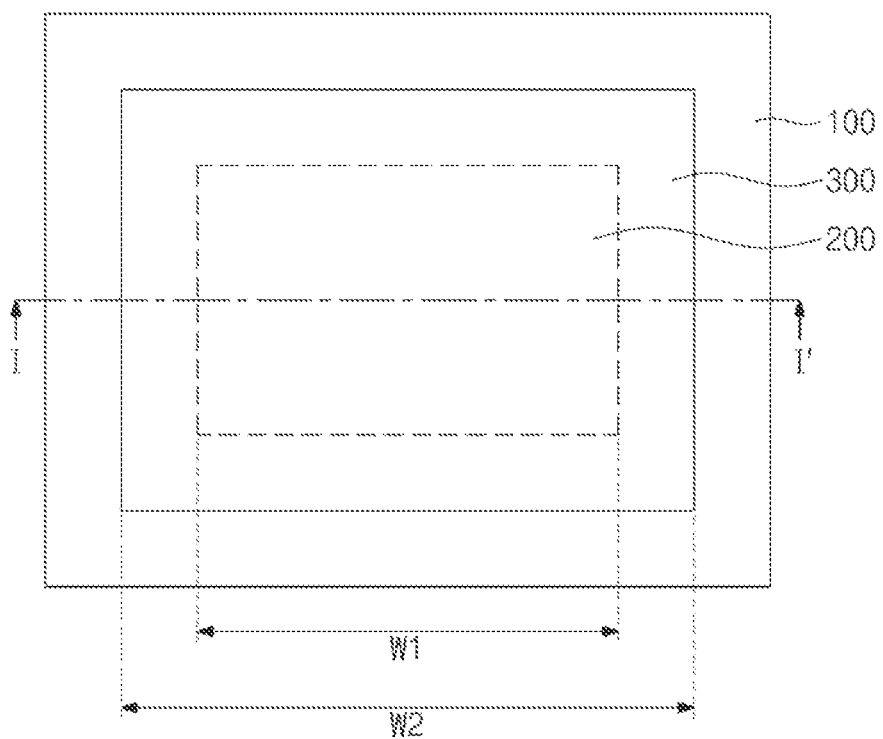
FIG. 1 is a plan view illustrating a semiconductor package according to an embodiment.
Figure 2:
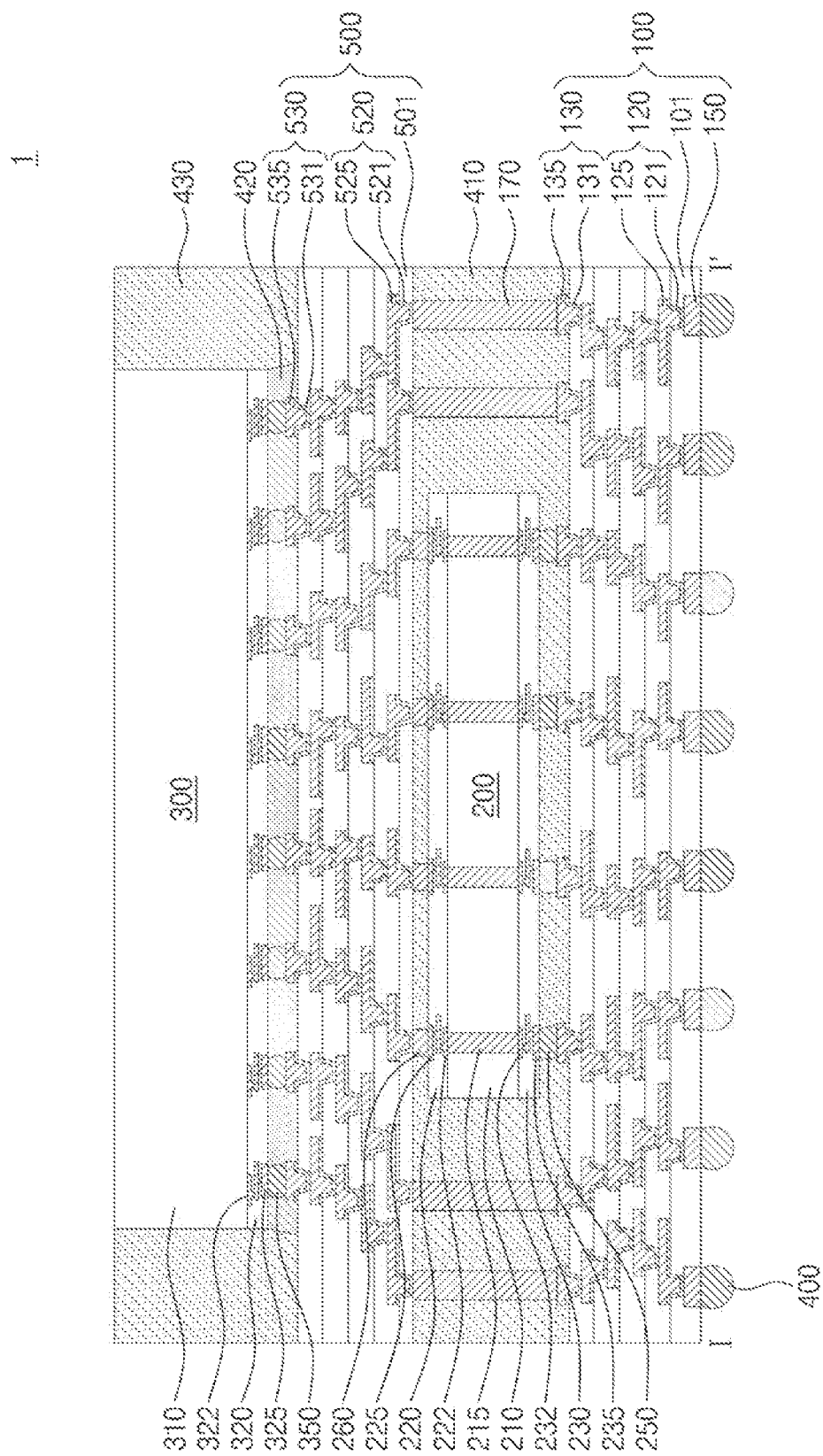
FIG. 2 is a sectional view, which is taken along a line I-I' of FIG. 1 to illustrate a semiconductor package according to an embodiment.

FIG. 1 is a plan view illustrating a semiconductor package according to an embodiment. FIG. 2 is a sectional view, which is taken along a line I-I' of FIG. 1 to illustrate a semiconductor package according to an embodiment.

Referring to FIGS. 1 and 2, a semiconductor package 1 may include a first redistribution substrate 100, a second redistribution substrate 500, a first semiconductor chip 200, and a second semiconductor chip 300.

The first redistribution substrate 100 may include a first insulating layer 101, a first redistribution pattern 120, a first under-bump pattern 150, and a first pad structure 130. The first insulating layer 101 may include a single layer or multiple layers. In an embodiment, there may be no observable interface between adjacent ones of the first insulating layers 101. In another embodiment, there may be an observable interface between adjacent ones of the first insulating layers 101. The number of the first insulating layers 101 stacked is not limited to the illustrated example, and may be variously changed. The first insulating layer 101 may be formed of or include at least one of insulating polymer and photoimageable polymer. The insulating polymer may include, for example, epoxy-based polymer. For example, the photoimageable polymer may include at least one of, for example, photoimageable polyimide, polybenzoxazole (PBO), phenol-based polymer, and benzocyclobutene-based polymer. In an embodiment, the first insulating layer 101 may be formed of or include one or more photo imageable dielectric (PID) material.

The first under-bump pattern 150 may be provided in the first insulating layer 101. The first insulating layer 101 may be disposed on the first under-bump pattern 150. The first insulating layer 101 may expose a bottom surface of the first under-bump pattern 150. The first under-bump pattern 150 may include a plurality of the first under-bump patterns 150, which are spaced apart from each other horizontally (e.g., in a direction parallel to a top surface of the first redistribution substrate 100). The first under-bump patterns 150 may serve as pads of outer terminals 400 to be described below, and may be electrically connected to the first redistribution patterns 120. The first under-bump pattern 150 may be formed of or include one or more conductive metal material (e.g., copper (Cu)). In the present disclosure, the expression "two elements are electrically connected/coupled to each other" may indicate that the elements are directly connected/coupled to each other or are indirectly connected/coupled to each other through another conductive element.

The first redistribution pattern 120 may be provided in the first insulating layer 101. The first redistribution pattern 120 may be disposed on a corresponding one of the first under-bump patterns 150. In an embodiment, a plurality of the first redistribution patterns 120 may be provided. However, the number of the first redistribution patterns 120 stacked is not limited to that in the illustrated example, and may be variously changed. Each of the first redistribution patterns 120 may include a first seed pattern 121 and a first conductive pattern 125. The first conductive pattern 125 may be disposed on the first seed pattern 121.

The first conductive pattern 125 may include a first via portion and a first wire portion on the first via portion. The first via portion and the first wire portion may be connected to each other, without any interface therebetween. In the present disclosure, a via portion of a conductive element may be a portion that is used for a vertical interconnection, and a wire portion of the conductive element may be a portion that is used for a horizontal interconnection. The first wire portion may have a long axis that is extended parallel to the top surface of the first redistribution substrate 100. The first wire portion may be disposed on a top surface of a corresponding one of the first insulating layers 101. In an embodiment, a width of the first wire portion may be greater than a width of the first via portion. The first via portion may have a shape protruding toward a bottom surface of the first redistribution substrate 100. For example, the uppermost width of the first via portion may be greater than the lowermost width of the first via portion. The first conductive pattern 125 may be formed of or include one or more conductive metal material (e.g., copper (Cu)). In the present disclosure, a width of an element may correspond to a length of the element measured in a direction parallel to the top surface of the first redistribution substrate 100.

The first seed pattern 121 may be provided on a bottom surface of the first conductive pattern 125. The first seed pattern 121 may be interposed between the first conductive pattern 125 and the first insulating layer 101. The first seed pattern 121 may be disposed on a bottom surface of the first wire portion, and may also be conformally disposed on side and bottom surfaces of the first via portion. The first seed pattern 121 of the lowermost one of the first redistribution patterns 120 may be interposed between the first conductive pattern 125 and the first insulating layer 101 and between the first conductive pattern 125 and the first under-bump pattern 150. The first seed pattern 121 may be formed of or include one or more conductive metal material (e.g., copper (Cu), tungsten (W), titanium (Ti), and/or alloys thereof). The first seed pattern 121 may serve as a barrier layer preventing a material in the first conductive pattern 125 from being diffused into neighboring elements.

The first pad structure 130 may be provided in the uppermost one of the first insulating layers 101. The first pad structure 130 may be disposed on the uppermost one of the first redistribution patterns 120. In an embodiment, a plurality of the first pad structures 130 may be provided to be horizontally spaced apart from each other. Each of the first pad structures 130 may include a first seed pad 131 and a first pad pattern 135. The first pad pattern 135 may be disposed on the first seed pad 131.

The first pad pattern 135 may include a first penetration portion and a first pad portion on the first penetration portion. The first penetration portion and the first pad portion may be connected to each other, without any interface therebetween. The first pad portion may be provided on the top surface of the uppermost one of the first insulating layers 101. The first pad portion may be exposed to the outside of the first insulating layers 101 near the top surface of the uppermost one of the first insulating layers 101. The first penetration portion may be provided in the uppermost one of the first insulating layers 101. The first penetration portion may have a shape protruding toward the bottom surface of the first redistribution substrate 100. For example, a width of the first pad portion may be greater than a width of the first penetration portion. For example, the uppermost width of the first penetration portion may be greater than the lowermost width of the first penetration portion. The first pad pattern 135 may be formed of or include one or more conductive metal material (e.g., copper (Cu)).

The first seed pad 131 may be provided on a bottom surface of the first pad pattern 135. The first seed pad 131 may be interposed between the first pad pattern 135 and the uppermost one of the first insulating layers 101. The first seed pads 131 may be interposed between the first pad pattern 135 and the uppermost one of the first insulating layers 101 and between the first pad pattern 135 and the uppermost one of the first redistribution patterns 120. The first seed pad 131 may be formed of or include one or more conductive metal material (e.g., copper (Cu), tungsten (W), titanium (Ti), and/or alloys thereof).

An outer terminal 400 may be provided on the bottom surface of the first redistribution substrate 100. The outer terminal 400 may be disposed on the bottom surface of the first under-bump pattern 150. In an embodiment, a plurality of the outer terminals 400 may be provided to be horizontally spaced apart from each other. The outer terminals 400 may be coupled to an external device. Accordingly, electrical signals may be exchanged between the external device and the first under-bump patterns 150 through the outer terminals 400. The outer terminals 400 may include solder balls or solder bumps. The outer terminals 400 may include a conductive metal material. The outer terminals 400 may be formed of or include at least one of, for example, tin (Sn), lead (Pb), silver (Ag), zinc (Zn), nickel (Ni), gold (Au), copper (Cu), aluminum (Al), and bismuth (Bi).

The first semiconductor chip 200 may be mounted on the first redistribution substrate 100. The first semiconductor chip 200 may be disposed on a center region of the first redistribution substrate 100, in a plan view. In an embodiment, the first semiconductor chip 200 may be a logic chip, a buffer chip, or a system-on-chip (SOC). As an example, the first semiconductor chip 200 may be an application specific integrated circuit (ASIC) chip or application processor (AP) chip. The ASIC chip may include an application specific integrated circuit (ASIC). As an example, the first semiconductor chip 200 may include a central processing unit (CPU) or a graphics processing unit (GPU).

The first semiconductor chip 200 may include a first chip substrate 210, a first upper interconnection layer 220, and a first lower interconnection layer 230. The first chip substrate 210 may be formed of or include one or more semiconductor material (e.g., silicon (Si), germanium (Ge), or silicon germanium (SiGe)).

A penetration via 215 may be provided in the first chip substrate 210. The penetration via 215 may be provided to penetrate the first chip substrate 210. In an embodiment, a plurality of the penetration vias 215 may be provided. The penetration via 215 may include a conductive metal material. The penetration via 215 may be formed of or include at least one of, for example, copper (Cu), aluminum (Al), tungsten (W), and titanium (Ti).

The first upper interconnection layer 220 may be provided on a top surface of the first chip substrate 210. The first upper interconnection layer 220 may be formed of or include at least one of, for example, silicon oxide (SiO$_2$), silicon nitride (SiN), and silicon oxynitride (SiNxOy). The first upper interconnection layer 220 may include a single layer or may include a plurality of stacked layers.

First upper interconnection structures 222 may be provided in the first upper interconnection layer 220. The first upper interconnection structures 222 may be electrically connected to the penetration vias 215. The first upper interconnection structures 222 may include a conductive metal material. The first upper interconnection structures 222 may be formed of or include at least one of, for example, copper (Cu), aluminum (Al), tungsten (W), and titanium (Ti).

First upper pads 225 may be provided in the first upper interconnection layer 220. The first upper pads 225 may be adjacent to a top surface of the first semiconductor chip 200. The first upper pads 225 may be disposed on the first upper interconnection structures 222. The first upper pads 225 may be exposed to the outside of the first semiconductor chip 200 near the top surface of the first semiconductor chip 200. The first upper pads 225 may include a conductive metal material. The first upper pads 225 may be formed of or include at least one of, for example, copper (Cu), aluminum (Al), tungsten (W), and titanium (Ti).

The first lower interconnection layer 230 may be provided on a bottom surface of the first chip substrate 210. The first lower interconnection layer 230 may be formed of or include at least one of silicon oxide, silicon nitride, and silicon oxynitride. The first lower interconnection layer 230 may include a single layer or may include a plurality of stacked layers.

First lower interconnection structures 232 may be provided in the first lower interconnection layer 230. The first lower interconnection structures 232 may be electrically connected to the penetration vias 215. The first lower interconnection structures 232 may include a conductive metal material. The first lower interconnection structures 232 may be formed of or include at least one of, for example, copper (Cu), aluminum (Al), tungsten (W), and titanium (Ti).

First lower pads 235 may be provided in the first lower interconnection layer 230. The first lower pads 235 may be adjacent to a bottom surface of the first semiconductor chip 200. The first lower pads 235 may be disposed on a bottom surface of the first lower interconnection structures 232. The first lower pads 235 may be exposed to the outside of the first semiconductor chip 200 near the bottom surface of the first semiconductor chip 200. The first lower pads 235 may include a conductive metal material. The first lower pads 235 may be formed of or include at least one of, for example, copper (Cu), aluminum (Al), tungsten (W), and titanium (Ti).

First bumps 250 may be interposed between the first redistribution substrate 100 and the first semiconductor chip 200. The first bumps 250 may be interposed between the first pad structures 130 and the first lower pads 235. The first semiconductor chip 200 and the first redistribution substrate 100 may be electrically connected to each other through the first bumps 250. The first bumps 250 may include solder balls or solder bumps. The first bumps 250 may include a conductive material. The first bumps 250 may be formed of or include at least one of, for example, tin (Sn), lead (Pb), silver (Ag), zinc (Zn), nickel (Ni), gold (Au), copper (Cu), aluminum (Al), and bismuth (Bi).

Second bumps 260 may be interposed between the first semiconductor chip 200 and the second redistribution substrate 500. The second bumps 260 may be interposed between the first upper pads 225 and the lowermost ones of second redistribution patterns 520 to be described below. The first semiconductor chip 200 and the second redistribution substrate 500 may be electrically connected to each other through the second bumps 260. In an embodiment, the second bumps 260 may include pillars. In another embodiment, the second bumps 260 may include solder balls or solder bumps. The second bumps 260 may include a conductive material. The second bumps 260 may be formed of or include at least one of, for example, tin (Sn), lead (Pb), silver (Ag), zinc (Zn), nickel (Ni), gold (Au), copper (Cu), aluminum (Al), and bismuth (Bi).

First conductive structures 170 may be provided on the first redistribution substrate 100. The first conductive structures 170 may be disposed on an edge region of the first redistribution substrate 100, in a plan view. The first conductive structures 170 may be arranged to enclose the first semiconductor chip 200, in a plan view. The first conductive structures 170 may be horizontally spaced apart from the first semiconductor chip 200. Each of the first conductive structures 170 may be disposed on a corresponding one of the first pad structures 130. Accordingly, the first conductive structures 170 may be electrically connected to the first redistribution substrate 100. In an embodiment, the first conductive structures 170 may be metal posts having a circular pillar shape. The first conductive structures 170 may be formed of or include one or more conductive metal material (e.g., copper (Cu)).

A first mold layer 410 may be provided on the first redistribution substrate 100. The first mold layer 410 may be interposed between the first redistribution substrate 100 and the second redistribution substrate 500. The first mold layer 410 may be disposed on the top surface of the first redistribution substrate 100 and side surfaces of the first conductive structures 170. The first mold layer 410 may be disposed on the first semiconductor chip 200. The first mold layer 410 may be interposed between the first redistribution substrate 100 and the first semiconductor chip 200 and between the first semiconductor chip 200 and the second redistribution substrate 500. The first mold layer 410 may be provided to fill a space between the first bumps 250 and hermetically seal side surfaces of the first bumps 250. Furthermore, the first mold layer 410 may be provided to fill a space between the second bumps 260 and hermetically seal side surfaces of the second bumps 260. The first mold layer 410 may include an insulating polymer (e.g., epoxy molding compound (EMC)).

The second redistribution substrate 500 may be provided on the first redistribution substrate 100. The second redistribution substrate 500 may be disposed on the first mold layer 410.

The second redistribution substrate 500 may include a second insulating layer 501, the second redistribution pattern 520, and a second pad structure 530. The second insulating layer 501 may include a single layer or multiple layers. In an embodiment, there may be no observable interface between adjacent ones of the second insulating layers 501. In another embodiment, there may be an observable interface between adjacent ones of the second insulating layers 501. The number of the second insulating layers 501 stacked is not limited to the illustrated example, and may be variously changed. The second insulating layer 501 may be formed of or include at least one of insulating polymer and photoimageable polymer. The insulating polymer may include, for example, epoxy-based polymer. For example, the photoimageable polymer may include at least one of, for example, photoimageable polyimide, polybenzoxazole (PBO), phenol-based polymer, and benzocyclobutene-based polymer. In an embodiment, the second insulating layer 501 may be formed of or include one or more photo imageable dielectric (PID) material.

The second redistribution pattern 520 may be provided in the second insulating layer 501. In an embodiment, a plurality of the second redistribution patterns 520 may be provided. However, the number of the second redistribution patterns 520 stacked is not limited to that in the illustrated example, and may be variously changed. Some of the second redistribution patterns 520 may be disposed on the first upper pads 225, and the others may be disposed on the first conductive structures 170. Each of the second redistribution patterns 520 may include a second seed pattern 521 and a second conductive pattern 525. The second conductive pattern 525 may be disposed on the second seed pattern 521.

The second conductive pattern 525 may include a second via portion and a second wire portion on the second via portion. The second via portion and the second wire portion may be connected to each other, without any interface therebetween. The second wire portion may have a long axis that is extended parallel to a top surface of the second redistribution substrate 500. The second wire portion may be disposed on a top surface of a corresponding one of the second insulating layers 501. For example, a width of the second wire portion may be greater than a width of the second via portion. The second via portion may have a shape protruding toward a bottom surface of the second redistribution substrate 500. For example, the uppermost width of the second via portion may be greater than the lowermost width of the second via portion. The second conductive pattern 525 may be formed of or include one or more conductive metal material (e.g., copper (Cu)).

The second seed pattern 521 may be provided on a bottom surface of the second conductive pattern 525. The second seed pattern 521 may be interposed between the second conductive pattern 525 and the second insulating layer 501. The second seed pattern 521 may be disposed on a bottom surface of the second wire portion, and may also be conformally disposed on side and bottom surfaces of the second via portion. The second seed pattern 521 may be formed of or include one or more conductive metal material (e.g., copper (Cu), tungsten (W), titanium (Ti), and/or alloys thereof). The second seed pattern 521 may serve as a barrier layer preventing a material in the second conductive pattern 525 from being diffused into neighboring elements.

The second pad structure 530 may be provided in the uppermost one of the second insulating layers 501. The second pad structure 530 may be disposed on the uppermost one of the second redistribution patterns 520. In an embodiment, a plurality of the second pad structures 530 may be provided to be horizontally spaced apart from each other. Each of the second pad structures 530 may include a second seed pad 531 and a second pad pattern 535. The second pad pattern 535 may be disposed on the second seed pad 531.

The second pad pattern 535 may include a second penetration portion and a second pad portion on the second penetration portion. The second penetration portion and the second pad portion may be connected to each other, without any interface therebetween. The second pad portion may be provided on the top surface of the uppermost one of the second insulating layers 501. The second pad portion may be exposed to the outside of the second insulating layers 501 near the top surface of the uppermost one of the second insulating layers 501. The second penetration portion may be provided in the uppermost one of the second insulating layers 501. The second penetration portion may have a shape protruding toward the bottom surface of the second redistribution substrate 500. For example, a width of the second pad portion may be greater than a width of the second penetration portion. For example, the uppermost width of the second penetration portion may be greater than the lowermost width of the second penetration portion. The second pad pattern 535 may be formed of or include one or more conductive metal material (e.g., copper (Cu)).

The second seed pad 531 may be provided on a bottom surface of the second pad pattern 535. The second seed pad 531 may be interposed between the second pad pattern 535 and the uppermost one of the second insulating layers 501. The second seed pad 531 may be interposed between the second pad pattern 535 and the uppermost one of the second insulating layers 501 and between the second pad pattern 535 and the uppermost one of the second redistribution patterns 520. The second seed pad 531 may be formed of or include one or more conductive metal material (e.g., copper (Cu), tungsten (W), titanium (Ti), and/or alloys thereof).

The second semiconductor chip 300 may be mounted on the second redistribution substrate 500. In an embodiment, the second semiconductor chip 300 may be a logic chip, a buffer chip, or a system-on-chip (SOC), but embodiments are not limited thereto. As an example, the second semiconductor chip 300 may be an ASIC chip or an AP chip. The ASIC chip may include an application specific integrated circuit (ASIC). As an example, the second semiconductor chip 300 may include a central processing unit (CPU) or a graphics processing unit (GPU).

In an embodiment, a width W1 of the first semiconductor chip 200 may be smaller than a width W2 of the second semiconductor chip 300. In a plan view, an area of the first semiconductor chip 200 may be smaller than an area of the second semiconductor chip 300. As an example, a thickness of the first semiconductor chip 200 may be smaller than a thickness of the second semiconductor chip 300. In the present disclosure, a thickness of an element may correspond to a distance between top and bottom surfaces of the element that is measured in a vertical direction perpendicular to the top surface of the first redistribution substrate 100.

The second semiconductor chip 300 may include a second chip substrate 310 and a second interconnection layer 320. The second chip substrate 310 may be formed of or include one or more semiconductor material (e.g., silicon, germanium, or silicon germanium).

The second interconnection layer 320 may be provided on a bottom surface of the second chip substrate 310. The second interconnection layer 320 may be formed of or include at least one of, for example, silicon oxide, silicon nitride, and silicon oxynitride. The second interconnection layer 320 may include a single layer or may include a plurality of stacked layers.

Second interconnection structures 322 may be provided in the second interconnection layer 320. The second interconnection structures 322 may include a conductive metal material. The second interconnection structures 322 may be formed of or include at least one of, for example, copper (Cu), aluminum (Al), tungsten (W), and titanium (Ti).

Second pads 325 may be provided in the second interconnection layer 320. The second pads 325 may be adjacent to a bottom surface of the second semiconductor chip 300. The second pads 325 may be disposed on bottom surfaces of the second interconnection structures 322. The second pads 325 may be exposed to the outside of the second semiconductor chip 300 near the bottom surface of the second semiconductor chip 300. The second pads 325 may include a conductive metal material. The second pads 325 may be formed of or include at least one of, for example, copper (Cu), aluminum (Al), tungsten (W), and titanium (Ti).

Third bumps 350 may be interposed between the second redistribution substrate 500 and the second semiconductor chip 300. The third bumps 350 may be interposed between the second pad structures 530 and the second pads 325. The second semiconductor chip 300 and the second redistribution substrate 500 may be electrically connected to each other through the third bumps 350. The third bumps 350 may include solder balls or solder bumps. The third bumps 350 may include a conductive material. The third bumps 350 may be formed of or include at least one of, for example, tin (Sn), lead (Pb), silver (Ag), zinc (Zn), nickel (Ni), gold (Au), copper (Cu), aluminum (Al), and bismuth (Bi).

An under-fill layer 420 may be interposed between the second redistribution substrate 500 and the second semiconductor chip 3M). The under-fill layer 420 may be provided to fill a space between the third bumps 350 and hermetically seal side surfaces of the third bumps 350. The under-fill layer 420 may include a non-conductive film (NCF), such as an Ajinomoto build-up film (ABF).

A second mold layer 430 may be provided on the second redistribution substrate 500. The second mold layer 430 may be spaced apart from the first mold layer 410. The second mold layer 430 may be disposed on the top surface of the second redistribution substrate 500. The second mold layer 430 may be disposed on the second semiconductor chip 300. The second mold layer 430 may be disposed on side surfaces of the second semiconductor chip 300 and may expose a top surface of the second semiconductor chip 300. A top surface of the second mold layer 430 may be disposed at substantially the same level as the top surface of the second semiconductor chip 300. Accordingly, heat, which is generated from the second semiconductor chip 300, may be more effectively exhausted to the outside. The second mold layer 430 may include an insulating polymer (e.g., epoxy molding compound (EMC)).

In an embodiment, the first semiconductor chip 200 may be disposed at a lower level of the semiconductor package, and the second semiconductor chip 300 may be disposed at an upper level of the semiconductor package. This may make it possible to mount the first and second semiconductor chips 200 and 300 in a relatively high device density. As a result, it may be possible to realize a semiconductor package with a relatively high package density or a small size.

Figure 3:
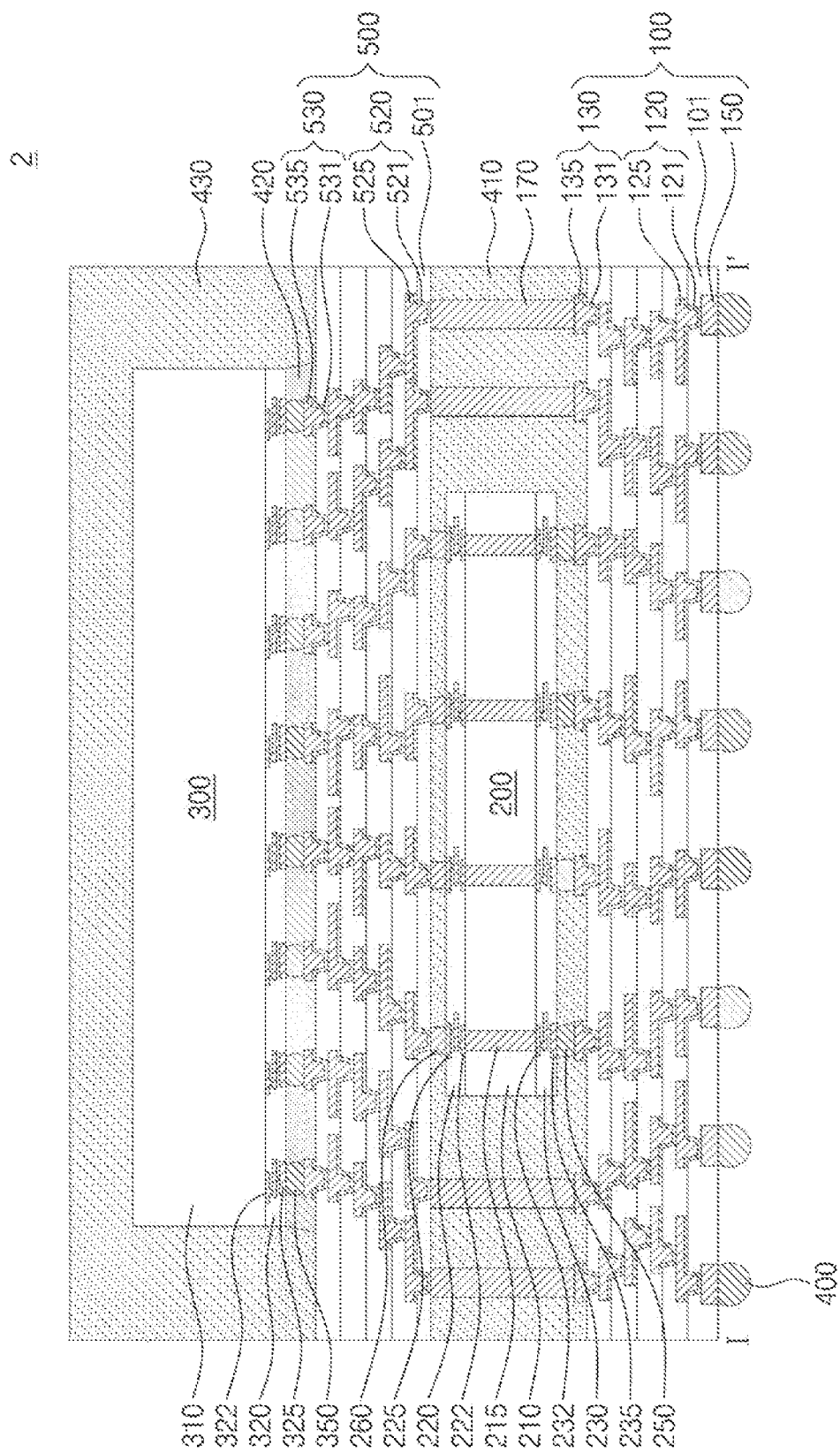
FIG. 3 is a sectional view, which is taken along the line I-I' of FIG. 1 to illustrate a semiconductor package according to an embodiment.

FIG. 3 is a sectional view, which is taken along the line I-I' of FIG. 1 to illustrate a semiconductor package according to an embodiment. For concise description, a previously described element may be identified by the same reference number without repeating duplicate descriptions thereof.

Referring to FIGS. 1 and 3, a semiconductor package 2 may include the first redistribution substrate 100, the second redistribution substrate 500, the first semiconductor chip 200, and the second semiconductor chip 300.

The second mold layer 430 may be provided on the second redistribution substrate 500. The second mold layer 430 may be disposed on the second semiconductor chip 300. The second mold layer 430 may be disposed on the side surfaces of the second semiconductor chip 300 and the top surface of the second semiconductor chip 3M). The top surface of the second mold layer 430 may be disposed at a level higher than the top surface of the second semiconductor chip 300. Accordingly, the second semiconductor chip 300 may be more effectively protected. In the present disclosure, a level of an element may correspond to a height of the element measured from the top surface of the first redistribution substrate 100.

Figure 4:
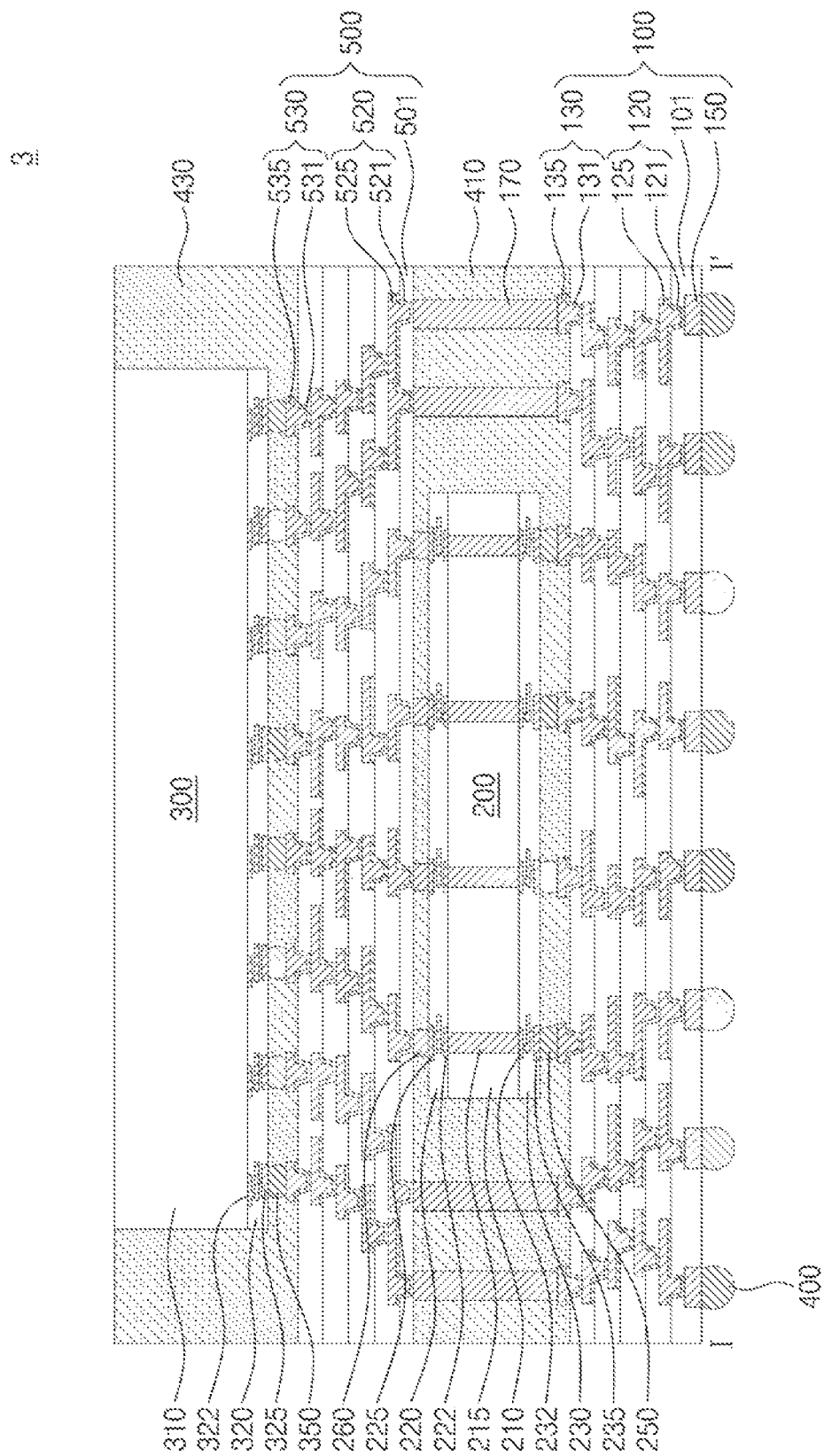
FIG. 4 is a sectional view, which is taken along the line I-I' of FIG. 1 to illustrate a semiconductor package according to an embodiment.

FIG. 4 is a sectional view, which is taken along the line I-I' of FIG. 1 to illustrate a semiconductor package according to an embodiment. For concise description, a previously described element may be identified by the same reference number without repeating duplicate descriptions thereof.

Referring to FIGS. 1 and 4, a semiconductor package 3 may include the first redistribution substrate 100, the second redistribution substrate 500, the first semiconductor chip 200, and the second semiconductor chip 300. However, the semiconductor package 3 may not include the under-fill layer 420 previously described with reference to FIG. 2.

The second mold layer 430 may be provided on the second redistribution substrate 500. The second mold layer 430 may be disposed on the second semiconductor chip 300. The second mold layer 430 may be disposed on the side surfaces of the second semiconductor chip 300, and may expose the top surface of the second semiconductor chip 300. The top surface of the second mold layer 430 may be disposed at substantially the same level as the top surface of the second semiconductor chip 300. The second mold layer 430 may be extended into a region between the second redistribution substrate 500 and the second semiconductor chip 300. The second mold layer 430 may be provided to fill a space between the third bumps 350 and seal or encapsulate side surfaces of the third bumps 350.

Figure 5:
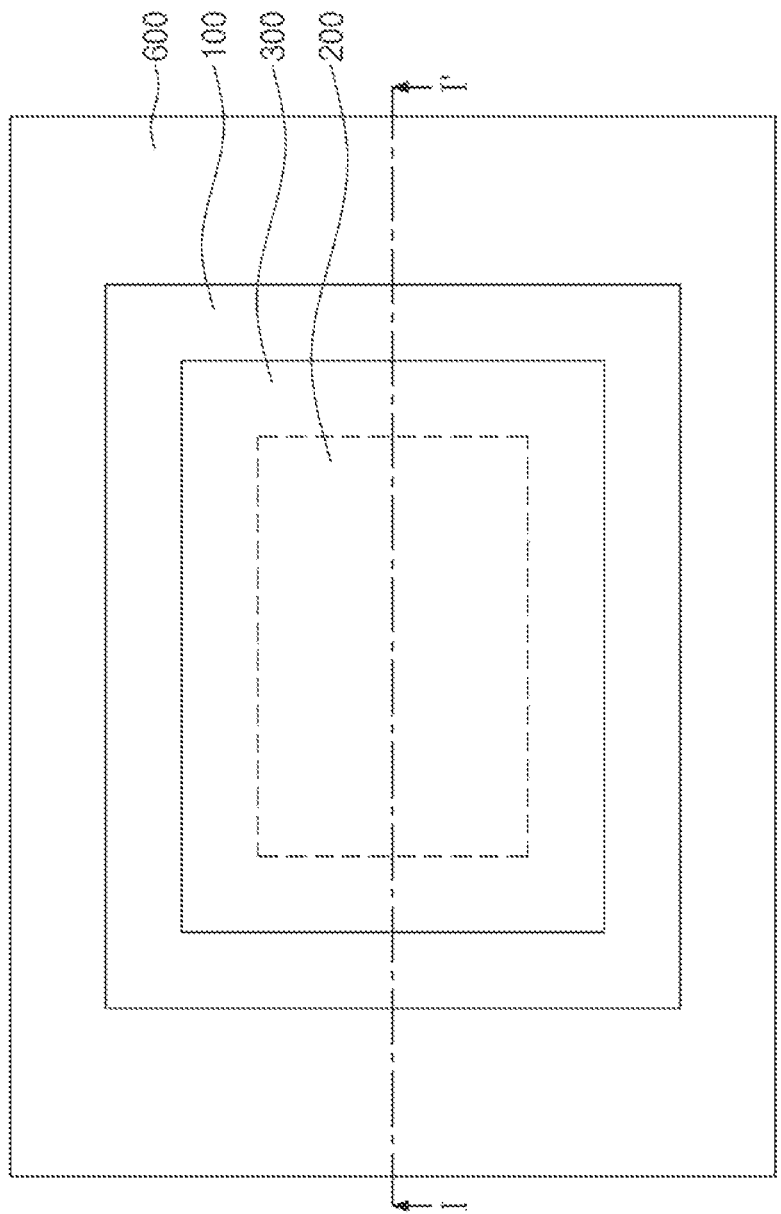
FIG. 5 is a plan view illustrating a semiconductor package according to an embodiment.
Figure 6:
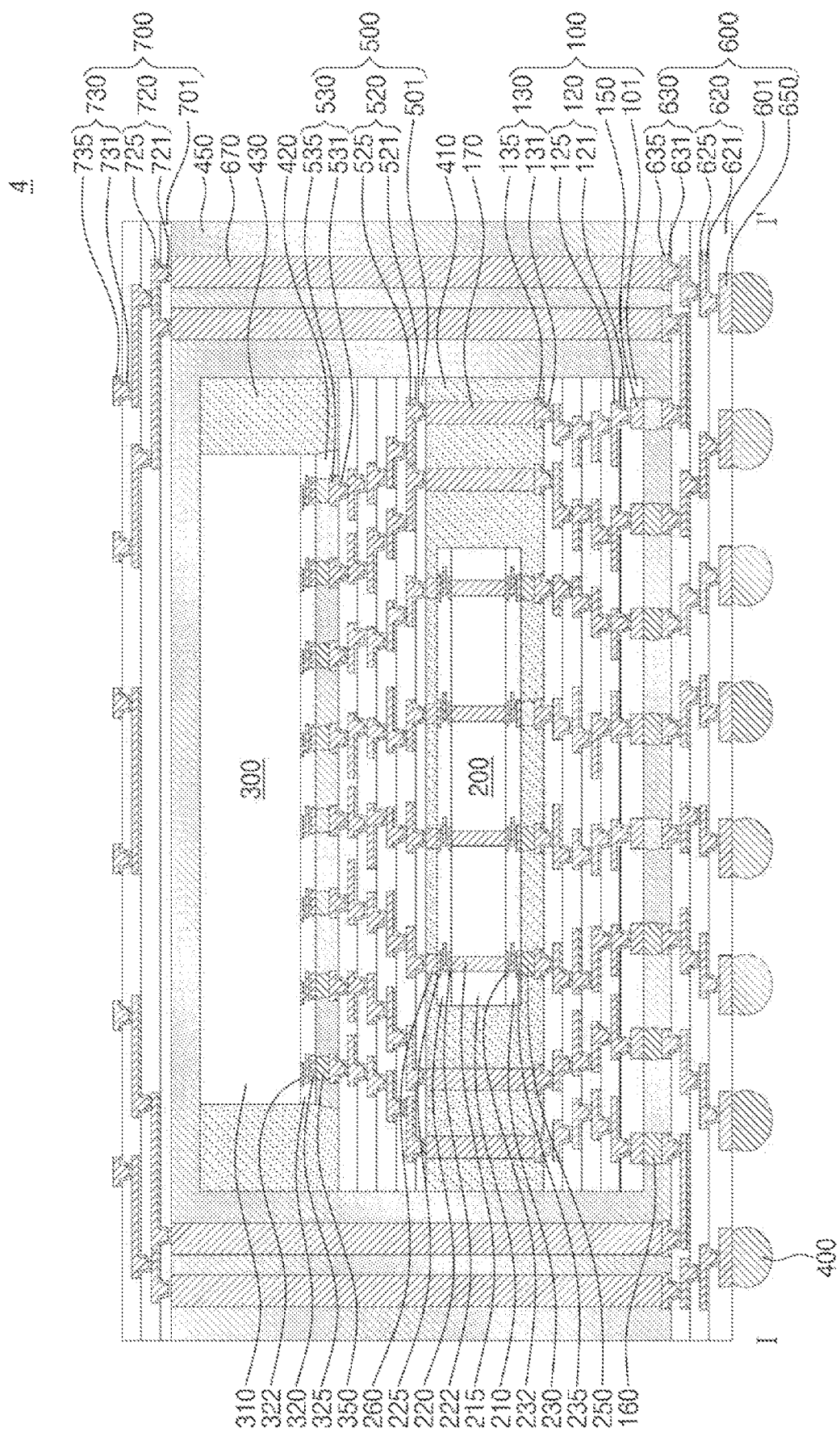
FIG. 6 is a sectional view, which is taken along a line I-I' of FIG. 5 to illustrate a semiconductor package according to an embodiment.

FIG. 5 is a plan view illustrating a semiconductor package according to an embodiment. FIG. 6 is a sectional view, which is taken along a line I-I' of FIG. 5 to illustrate a semiconductor package according to an embodiment. For concise description, a previously described element may be identified by the same reference number without repeating duplicate descriptions thereof.

Referring to FIGS. 5 and 6, a semiconductor package 4 may include a first substrate 600, a second substrate 700, and a lower semiconductor package.

The lower semiconductor package may be provided on the first substrate 600. The lower semiconductor package may include the first redistribution substrate 100, the second redistribution substrate 500, the first semiconductor chip 200, and the second semiconductor chip 300. The first redistribution substrate 100 may be disposed on the first substrate 600. The lower semiconductor package may be substantially the same as the semiconductor package 1 previously described with reference to FIGS. 1 and 2.

The first substrate 600 may include a third insulating layer 601, a third redistribution pattern 620, a second under-bump pattern 650, and a third pad structure 630. The third insulating layer 601 may include a single layer or multiple layers. In an embodiment, there may be no observable interface between adjacent ones of the third insulating layers 601. In another embodiment, there may be an observable interface between adjacent ones of the third insulating layers 601. However, the number of the third insulating layers 601 stacked is not limited to that in the illustrated example, and may be variously changed. The third insulating layer 601 may be formed of or include at least one of insulating polymer and photoimageable polymer. The insulating polymer may include, for example, epoxy-based polymers. For example, the photoimageable polymer may include at least one of, for example, photoimageable polyimide, polybenzoxazole (PBO), phenol-based polymer, and benzocyclobutene-based polymer. As an example, the third insulating layer 601 may be formed of or include one or more photo imageable dielectric (PID) material.

The second under-bump pattern 650 may be provided in the third insulating layer 601. The third insulating layer 601 may be disposed on the second under-bump pattern 650. The third insulating layer 601 may expose a bottom surface of the second under-bump pattern 650. In an embodiment, a plurality of the second under-bump patterns 650 may be provided to be horizontally spaced apart from each other. The second under-bump patterns 650 may serve as pads of the outer terminals 400 and may be electrically connected to the third redistribution pattern 620. The second under-bump pattern 650 may be formed of or include one or more conductive metal material (e.g., copper (Cu)).

The third redistribution pattern 620 may be provided in the third insulating layer 601. The third redistribution pattern 620 may be disposed on a corresponding one of the second under-bump patterns 650. In an embodiment, a plurality of the third redistribution patterns 620 may be provided. However, the number of the third redistribution patterns 620 stacked is not limited to that in the illustrated example, and may be variously changed. Each of the third redistribution patterns 620 may include a third seed pattern 621 and a third conductive pattern 625. The third conductive pattern 625 may be disposed on the third seed pattern 621.

The third conductive pattern 625 may include a third via portion and a third wire portion on the third via portion. The third via portion and the third wire portion may be connected to each other, without any interface therebetween. The third wire portion may have a long axis that is extended parallel to the top surface of the first redistribution substrate 100. The third wire portion may be disposed on a top surface of a corresponding one of the third insulating layers 601. For example, a width of the third wire portion may be greater than a width of the third via portion. The third via portion may have a shape protruding toward a bottom surface of the first substrate 600. For example, the uppermost width of the third via portion may be greater than the lowermost width of the third via portion. The third conductive pattern 625 may be formed of or include one or more conductive metal material (e.g., copper (Cu)).

The third seed pattern 621 may be provided on a bottom surface of the third conductive pattern 625. The third seed pattern 621 may be interposed between the third conductive pattern 625 and the third insulating layer 601. The third seed pattern 621 may be disposed on a bottom surface of the third wire portion, and may also be conformally disposed on side and bottom surfaces of the third via portion. The third seed pattern 621 of the lowermost one of the third redistribution patterns 620 may be interposed between the third conductive pattern 625 and the first insulating layer 101 and between the third conductive pattern 625 and the second under-bump pattern 650. The third seed pattern 621 may be formed of or include one or more conductive metal material (e.g., copper (Cu), tungsten (W), titanium (Ti), and/or alloys thereof). The third seed pattern 621 may serve as a barrier layer preventing a material in the third conductive pattern 625 from being diffused into neighboring elements.

The third pad structure 630 may be provided in the uppermost one of the third insulating layers 601. The third pad structure 630 may be disposed on the uppermost one of the third redistribution patterns 620. In an embodiment, a plurality of the third pad structures 630 may be provided to be horizontally spaced apart from each other. Each of the third pad structures 630 may include a third seed pad 631 and a third pad pattern 635. The third pad pattern 635 may be disposed on the third seed pad 631.

The third pad pattern 635 may include a third penetration portion and a third pad portion on the third penetration portion. The third penetration portion and the third pad portion may be connected to each other, without any interface therebetween. The third pad portion may be provided on a top surface of the uppermost one of the third insulating layers 601. The third pad portion may be exposed to the outside of the third insulating layers 601 near the top surface of the uppermost one of the third insulating layers 601. The third penetration portion may be provided in the uppermost one of the third insulating layers 601. The third penetration portion may have a shape protruding toward the bottom surface of the first substrate 600. For example, a width of the third pad portion may be greater than a width of the third penetration portion. For example, the uppermost width of the third penetration portion may be greater than the lowermost width of the third penetration portion. The third pad pattern 635 may be formed of or include one or more conductive metal material (e.g., copper (Cu)).

The third seed pad 631 may be provided on a bottom surface of the third pad pattern 635. The third seed pad 631 may be interposed between the third pad pattern 635 and the uppermost one of the third insulating layers 601. The third seed pad 631 may be interposed between the third pad pattern 635 and the uppermost one of the third insulating layers 601 and between the third pad pattern 635 and the uppermost one of the third redistribution patterns 620. The third seed pad 631 may be formed of or include one or more conductive metal material (e.g., copper (Cu), tungsten (W), titanium (Ti), and/or alloys thereof).

The outer terminals 400 may be provided on the bottom surface of the first substrate 600. The outer terminals 400 may be disposed on a bottom surface of the second under-bump patterns 650. Electrical signals may be exchanged between an external device and the second under-bump patterns 650 through the outer terminals 400.

Substrate bumps 160 may be interposed between the first substrate 600 and the lower semiconductor package. The substrate bumps 160 may be interposed between the third pad structures 630 and the first under-bump patterns 150. The first substrate 600 and the lower semiconductor package may be electrically connected to each other through the substrate bumps 160. The substrate bumps 160 may include solder balls or solder bumps. The substrate bumps 160 may include a conductive material. The substrate bumps 160 may be formed of or include at least one of, for example, tin (Sn), lead (Pb), silver (Ag), zinc (Zn), nickel (Ni), gold (Au), copper (Cu), aluminum (Al), and bismuth (Bi).

Second conductive structures 670 may be provided on the first substrate 600. The second conductive structures 670 may be disposed on an edge region of the first substrate 600, in a plan view. The second conductive structures 670 may be arranged to enclose the lower semiconductor package, in a plan view. The second conductive structures 670 may be horizontally spaced apart from the lower semiconductor package. The second conductive structures 670 may be horizontally spaced apart from the first redistribution substrate 100. Each of the second conductive structures 670 may be disposed on a corresponding one of the third pad structures 630. Accordingly, the second conductive structures 670 may be electrically connected to the first substrate 600. The second conductive structures 670 may be metal posts having a circular pillar shape. The second conductive structures 670 may be formed of or include one or more conductive metal material (e.g., copper (Cu)).

A third mold layer 450 may be provided on the first substrate 600. The third mold layer 450 may be interposed between the first substrate 600 and the second substrate 700. The third mold layer 450 may be disposed on a top surface of the first substrate 600 and side surfaces of the second conductive structures 670. The third mold layer 450 may be disposed on side surfaces of the first redistribution substrate 100, side surfaces of the second redistribution substrate 500, and side surfaces of the first mold layer 410. The third mold layer 450 may be disposed on the second mold layer 430 and the top surface of the second semiconductor chip 300. The third mold layer 450 may be interposed between the second semiconductor chip 300 and the second substrate 700. The third mold layer 450 may be provided to fill a space between the substrate bumps 160 and hermetically seal side surfaces of the substrate bumps 160. The third mold layer 450 may be in direct contact with side surfaces of the first mold layer 410 and may be in direct contact with the second mold layer 430. There may be observable interfaces between the third mold layer 450 and the first mold layer 410 and between the third mold layer 450 and the second mold layer 430. The third mold layer 450 may include an insulating polymer (e.g., epoxy molding compound (EMC)).

The second substrate 700 may be provided on the first substrate 600. The second substrate 700 may be disposed on the third mold layer 450.

The second substrate 700 may include a fourth insulating layer 701, a fourth redistribution pattern 720, and a fourth pad structure 730. The fourth insulating layer 701 may include a single layer or multiple layers. In an embodiment, there may be no observable interface between adjacent ones of the fourth insulating layers 701. In another embodiment, there may be an observable interface between adjacent ones of the fourth insulating layers 701. However, the number of the fourth insulating layers 701 stacked is not limited to that in the illustrated example, and may be variously changed. The fourth insulating layer 701 may be formed of or include at least one of insulating polymer and photoimageable polymer. The insulating polymer may include, for example, epoxy-based polymer. For example, the photoimageable polymer may include at least one of, for example, photo-imageable polyimide, polybenzoxazole (PBO), phenol-based polymer, and benzocyclobutene-based polymer. As an example, the fourth insulating layer 701 may be formed of or include one or more photo imageable dielectric (PID) material.

The fourth redistribution pattern 720 may be provided in the fourth insulating layer 701. In an embodiment, a plurality of the fourth redistribution patterns 720 may be provided. However, the number of the fourth redistribution patterns 720 stacked is not limited to that in the illustrated example and may be variously changed. The fourth redistribution patterns 720 may be disposed on the second conductive structures 670. Each of the fourth redistribution patterns 720 may include a fourth seed pattern 721 and a fourth conductive pattern 725. The fourth conductive pattern 725 may be disposed on the fourth seed pattern 721.

The fourth conductive pattern 725 may include a fourth via portion and a fourth wire portion on the fourth via portion. The fourth via portion and the fourth wire portion may be connected to each other, without any interface therebetween. The fourth wire portion may have a long axis that is extended parallel to a top surface of the second substrate 700. The fourth wire portion may be disposed on a top surface of a corresponding one of the fourth insulating layers 701. For example, a width of the fourth wire portion may be greater than a width of the fourth via portion. The fourth via portion may have a shape protruding toward a bottom surface of the second substrate 700. For example, the uppermost width of the fourth via portion may be greater than the lowermost width of the fourth via portion. The fourth conductive pattern 725 may be formed of or include one or more conductive metal material (e.g., copper (Cu)).

The fourth seed pattern 721 may be provided on a bottom surface of the fourth conductive pattern 725. The fourth seed pattern 721 may be interposed between the fourth conductive pattern 725 and the fourth insulating layer 701. The fourth seed pattern 721 may be disposed on a bottom surface of the fourth wire portion, and may also be conformally disposed on side and bottom surfaces of the fourth via portion. The fourth seed pattern 721 may be formed of or include one or more conductive metal material (e.g., copper (Cu), tungsten (W), titanium (Ti), and/or alloys thereof). The fourth seed pattern 721 may serve as a barrier layer preventing a material in the fourth conductive pattern 725 from being diffused into neighboring elements.

The fourth pad structure 730 may be provided in the uppermost one of the fourth insulating layers 701. The fourth pad structure 730 may be disposed on the uppermost one of the fourth redistribution patterns 720. In an embodiment, a plurality of the fourth pad structures 730 may be provided to be horizontally spaced apart from each other. Each of the fourth pad structures 730 may include a fourth seed pad 731 and a fourth pad pattern 735. The fourth pad pattern 735 may be disposed on the fourth seed pad 731.

The fourth pad pattern 735 may include a fourth penetration portion and a fourth pad portion on the fourth penetration portion. The fourth penetration portion and the fourth pad portion may be connected to each other, without any interface therebetween. The fourth pad portion may be provided on a top surface of the uppermost one of the fourth insulating layers 701. The fourth pad portion may be exposed to the outside of the fourth insulating layers 701 near the top surface of the uppermost one of the fourth insulating layers 701. The fourth penetration portion may be provided in the uppermost one of the fourth insulating layers 701. The fourth penetration portion may have a shape protruding toward a bottom surface of the second substrate 700. For example, a width of the fourth pad portion may be greater than a width of the fourth penetration portion. For example, the uppermost width of the fourth penetration portion may be greater than the lowermost width of the fourth penetration portion. The fourth pad pattern 735 may be formed of or include one or more conductive metal material (e.g., copper (Cu)).

The fourth seed pad 731 may be provided on a bottom surface of the fourth pad pattern 735. The fourth seed pad 731 may be interposed between the fourth pad pattern 735 and the uppermost one of the fourth insulating layers 701. The fourth seed pad 731 may be interposed between the fourth pad pattern 735 and the uppermost one of the fourth insulating layers 701 and between the fourth pad pattern 735 and the uppermost one of the fourth redistribution patterns 720. The fourth seed pad 731 may be formed of or include one or more conductive metal material (e.g., copper (Cu), tungsten (W), titanium (Ti), and/or alloys thereof).

Figure 7:
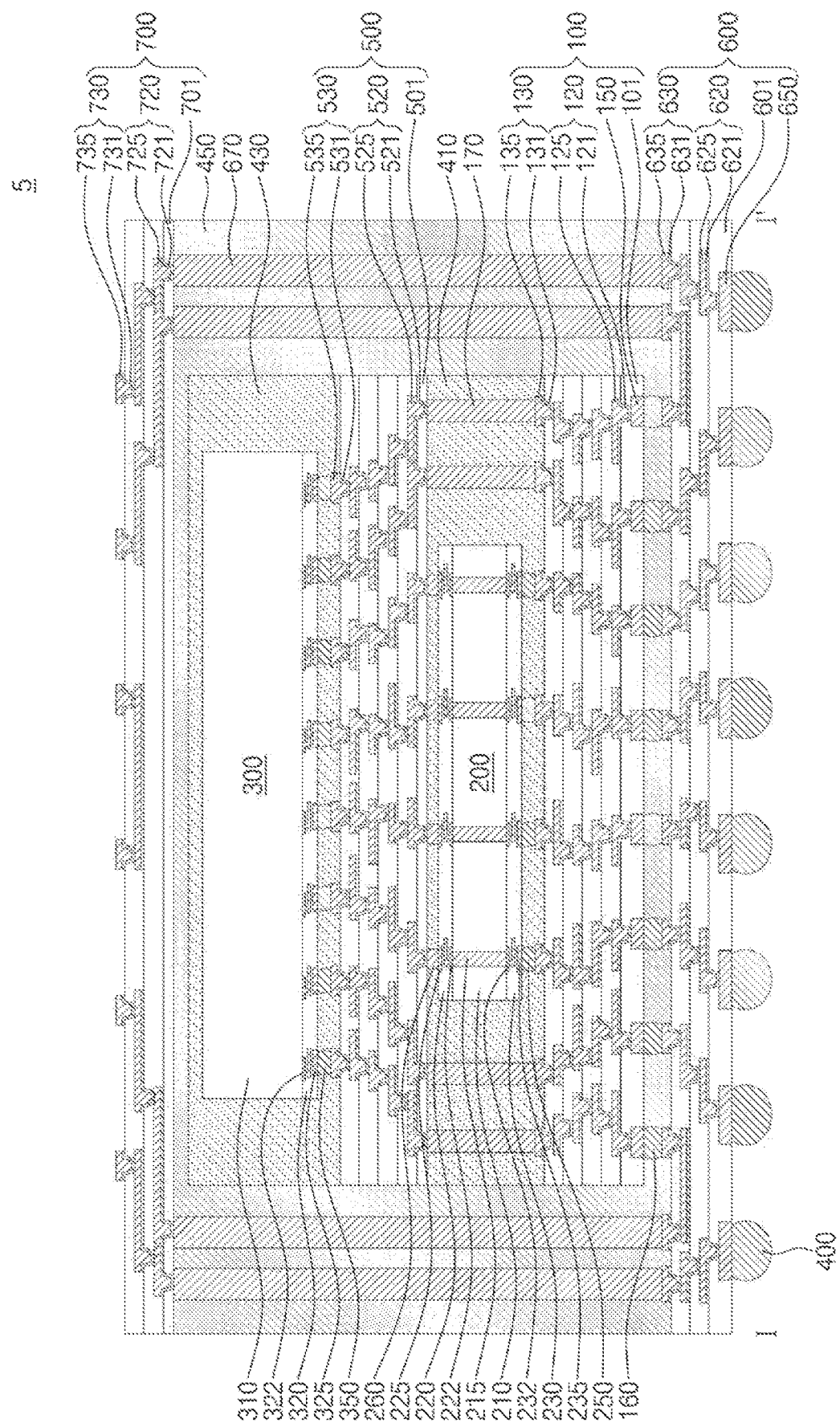
FIG. 7 is a sectional view, which is taken along the line I-I' of FIG. 5 to illustrate a semiconductor package according to an embodiment.

FIG. 7 is a sectional view, which is taken along the line I-I' of FIG. 5 to illustrate a semiconductor package according to an embodiment. For concise description, a previously described element may be identified by the same reference number without repeating duplicate descriptions thereof.

Referring to FIGS. 5 and 7, a semiconductor package 5 may include the first substrate 600, the second substrate 700, and the lower semiconductor package. The lower semiconductor package may be provided on the first substrate 600. The lower semiconductor package may include the first redistribution substrate 100, the second redistribution substrate 500, the first semiconductor chip 200, and the second semiconductor chip 300.

The second mold layer 430 may be disposed on the second semiconductor chip 300. The second mold layer 430 may be disposed on the side surfaces of the second semiconductor chip 300, and may also be disposed on the top surface of the second semiconductor chip 300. The top surface of the second mold layer 430 may be disposed at a level higher than the top surface of the second semiconductor chip 300.

The third mold layer 450 may be interposed between the first substrate 600 and the second substrate 700. The third mold layer 450 may be disposed on the second mold layer 430. The third mold layer 450 may be interposed between the second mold layer 430 and the second substrate 700.

Figure 8:
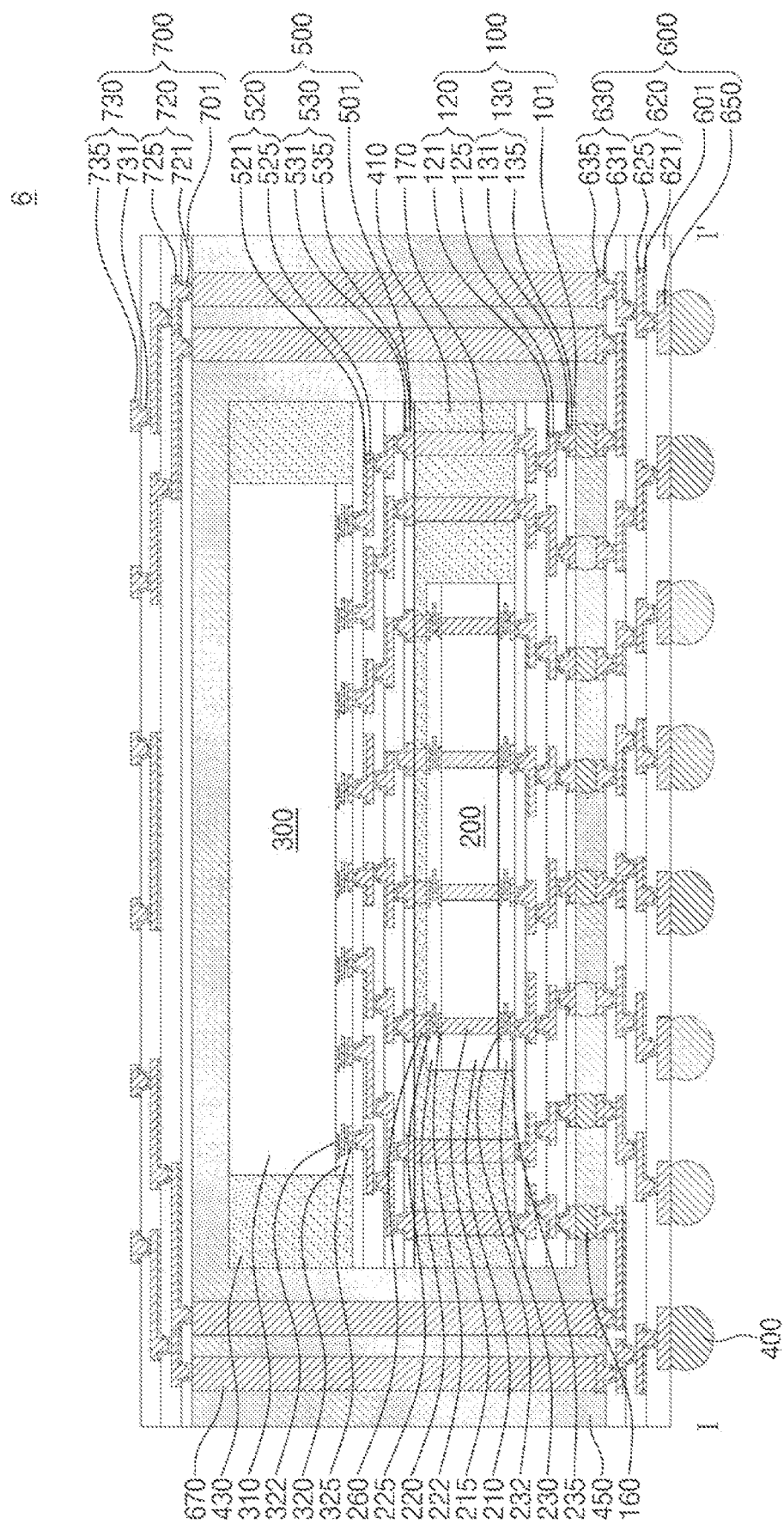
FIG. 8 is a sectional view, which is taken along the line I-I' of FIG. 5 to illustrate a semiconductor package according to an embodiment.

FIG. 8 is a sectional view, which is taken along the line I-I' of FIG. 5 to illustrate a semiconductor package according to an embodiment. For concise description, a previously described element may be identified by the same reference number without repeating duplicate descriptions thereof.

Referring to FIGS. 5 and 8, a semiconductor package 6 may include the first substrate 600, the second substrate 700, and the lower semiconductor package. The lower semiconductor package may be provided on the first substrate 600. The lower semiconductor package may include the first redistribution substrate 100, the second redistribution substrate 500, the first semiconductor chip 200, and the second semiconductor chip 300. However, the semiconductor package 6 may not include the first under-bump patterns 150, the first bumps 250, and the third bumps 350 described with reference to FIG. 1.

The first redistribution substrate 100 may include the first insulating layer 101, the first redistribution patterns 120, and the first pad structures 130. The first pad structures 130 may be provided in the lowermost one of the first insulating layers 101. Each of the first pad structures 130 may include the first pad pattern 135 and the first seed pad 131 on the first pad pattern 135. The first pad pattern 135 may include a first pad portion and a first penetration portion on the first pad portion.

The first redistribution patterns 120 may be disposed on the first pad structures 130. Each of the first redistribution patterns 120 may include the first conductive pattern 125 and the first seed pattern 121 on the first conductive pattern 125. The first conductive pattern 125 may include a first wire portion and a first via portion on the first wire portion.

The substrate bumps 160 may be disposed on bottom surfaces of the first pad structures 130 and may be electrically connected to the first pad structures 130.

The first lower pads 235 of the first semiconductor chip 200 or the first conductive structures 170 may be coupled to the uppermost ones of the first redistribution patterns 120.

The second redistribution substrate 500 may include the second insulating layer 501, the second redistribution patterns 520, and the second pad structures 530. The second pad structures 530 may be provided in the lowermost one of the second insulating layers 501. Some of the second pad structures 530 may be disposed on the first conductive structures 170, and the others may be disposed on the second bumps 260. Each of the second pad structures 530 may include the second pad pattern 535 and the second seed pad 531 on the second pad pattern 535. The second pad pattern 535 may include a second pad portion and a second penetration portion on the second pad portion.

Each of the second redistribution patterns 520 may include the second conductive pattern 525 and the second seed pattern 521 on the second conductive pattern 525. The second conductive pattern 525 may include a second wire portion and a second via portion on the second wire portion.

The second pads 325 of the second semiconductor chip 300 may be coupled to the uppermost ones of the second redistribution patterns 520.

Figure 9:
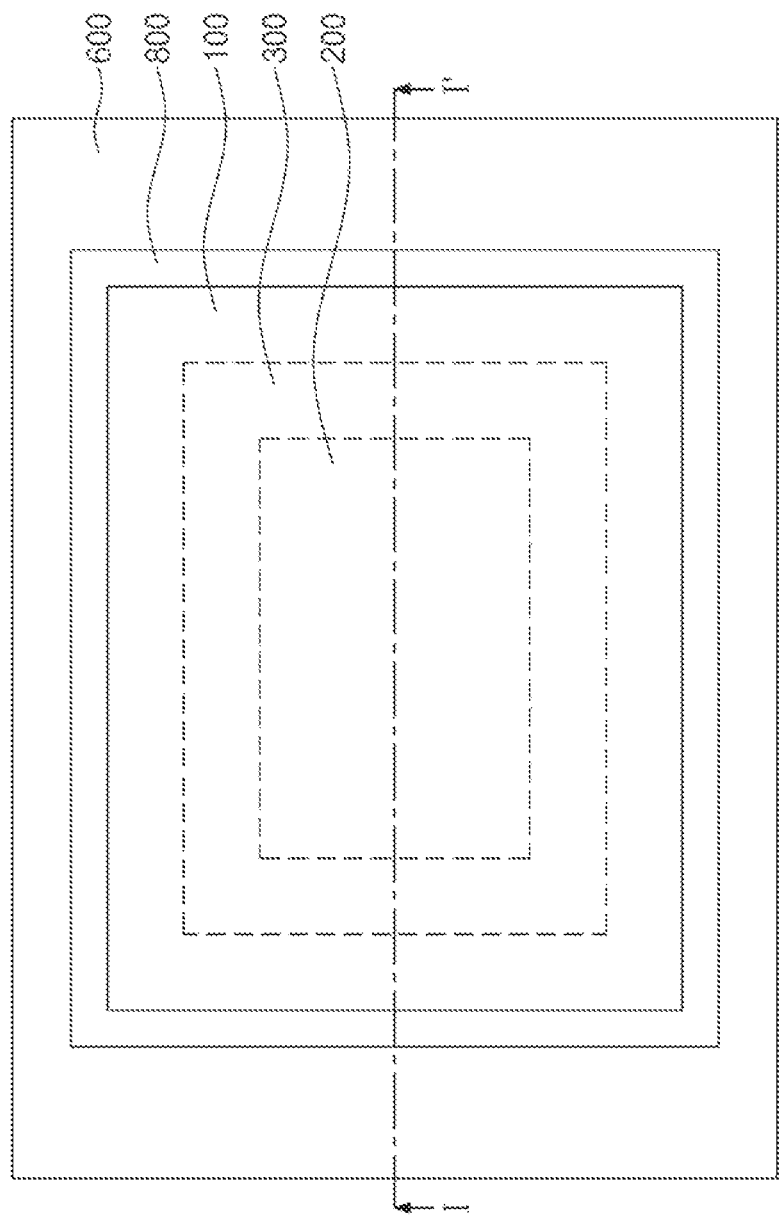
FIG. 9 is a plan view illustrating a semiconductor package according to an embodiment.
Figure 10:
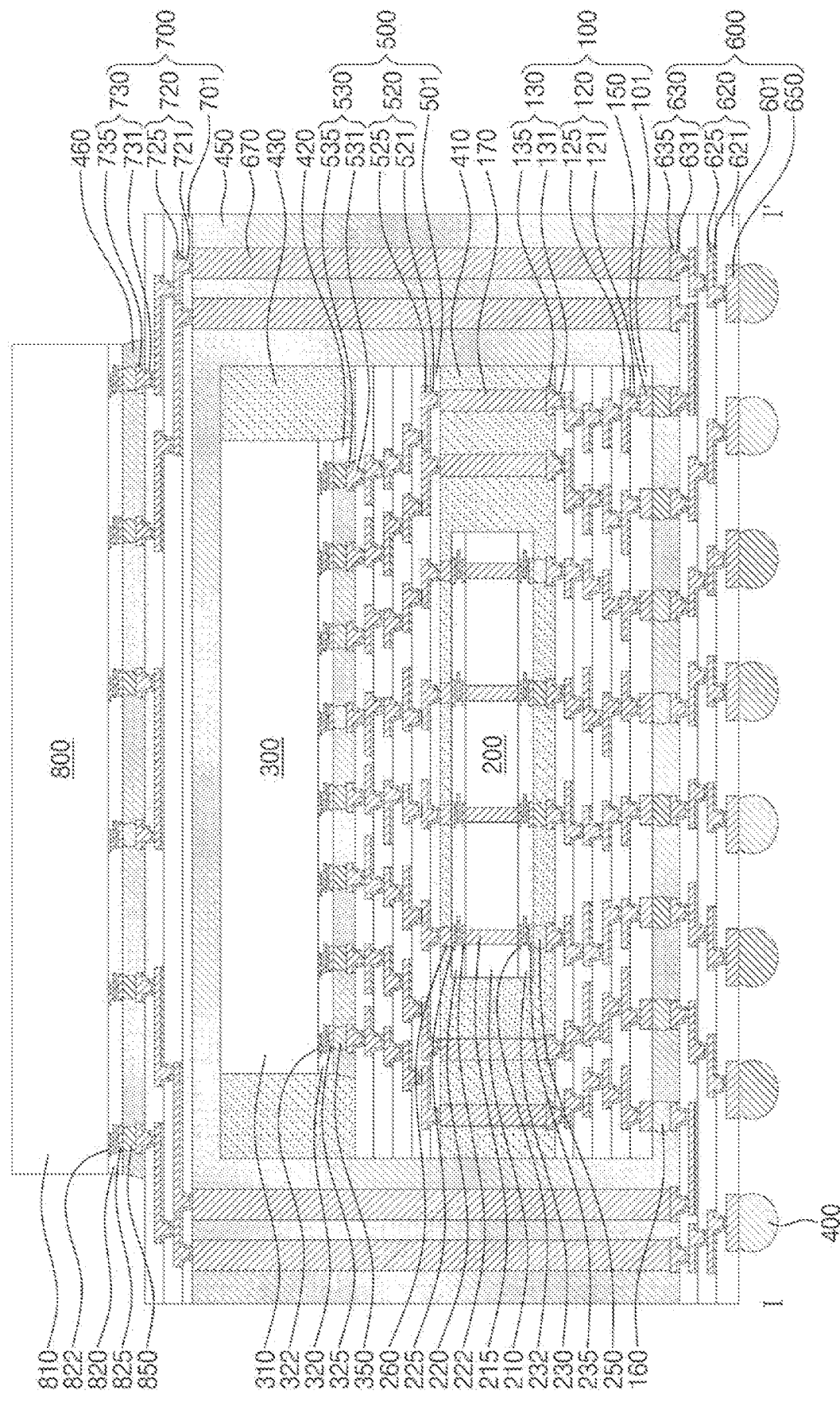
FIG. 10 is a sectional view, which is taken along a line I-I' of FIG. 9 to illustrate a semiconductor package according to an embodiment.

FIG. 9 is a plan view illustrating a semiconductor package according to an embodiment. FIG. 10 is a sectional view, which is taken along a line I-I' of FIG. 9 to illustrate a semiconductor package according to an embodiment. For concise description, a previously described element may be identified by the same reference number without repeating duplicate descriptions thereof.

Referring to FIGS. 9 and 10, a semiconductor package 7 may further include a third semiconductor chip 800, in addition to the first substrate 600, the second substrate 700, and the lower semiconductor package. The lower semiconductor package may be substantially the same as the semiconductor package 1 previously described with reference to FIGS. 1 and 2.

The third semiconductor chip 800 may be mounted on the second substrate 700. In an embodiment, the third semiconductor chip 800 may be a memory chip, but embodiments are not limited thereto. The memory chip may be or include at least one of dynamic random-access memory (DRAM), static random-access memory (SRAM), magnetic random-access memory (MRAM), and FLASH memory chips.

The third semiconductor chip 800 may include a third chip substrate 810 and a third interconnection layer 820. The third chip substrate 810 may be formed of or include at one or more semiconductor material (e.g., silicon, germanium, or silicon germanium).

The third interconnection layer 820 may be provided on a bottom surface of the third chip substrate 810. The third interconnection layer 820 may be formed of or include at least one of, for example, silicon oxide, silicon nitride, and silicon oxynitride. The third interconnection layer 820 may include a single layer or may include a plurality of stacked layers.

Third interconnection structures 822 may be provided in the third interconnection layer 820. The third interconnection structures 822 may include a conductive metal material. The third interconnection structures 822 may be formed of or include at least one of, for example, copper (Cu), aluminum (Al), tungsten (W), and titanium (Ti).

Third pads 825 may be provided in the third interconnection layer 820. The third pads 825 may be adjacent to a bottom surface of the third semiconductor chip 800. The third pads 825 may be disposed on bottom surfaces of the third interconnection structures 822. The third pads 825 may be exposed to the outside of the third semiconductor chip 800 near the bottom surface of the third semiconductor chip 800. The third pads 825 may include a conductive metal material. The third pads 825 may be formed of or include at least one of, for example, copper (Cu), aluminum (Al), tungsten (W), and titanium (Ti).

Fourth bumps 850 may be interposed between the second substrate 700 and the third semiconductor chip 800. The fourth bumps 850 may be interposed between the fourth pad structures 730 and the third pads 825. The third semiconductor chip 800 and the second substrate 700 may be electrically connected to each other through the fourth bumps 850. The fourth bumps 850 may include solder balls or solder bumps. The fourth bumps 850 may include a conductive material. The fourth bumps 850 may be formed of or include at least one of, for example, tin (Sn), lead (Pb), silver (Ag), zinc (Zn), nickel (Ni), gold (Au), copper (Cu), aluminum (Al), and bismuth (Bi).

A chip under-fill layer 460 may be interposed between the second substrate 700 and the third semiconductor chip 800. The chip under-fill layer 460 may be provided to fill a space between the fourth bumps 850 and to seal or encapsulate the fourth bumps 850. The chip under-fill layer 460 may include a non-conductive film (NCF), such as an Ajinomoto build-up film (ABF).

According to another embodiment, the second mold layer 430 may be provided on the second redistribution substrate 500 to be disposed on the top surface of the second semiconductor chip 300.

Figure 11:
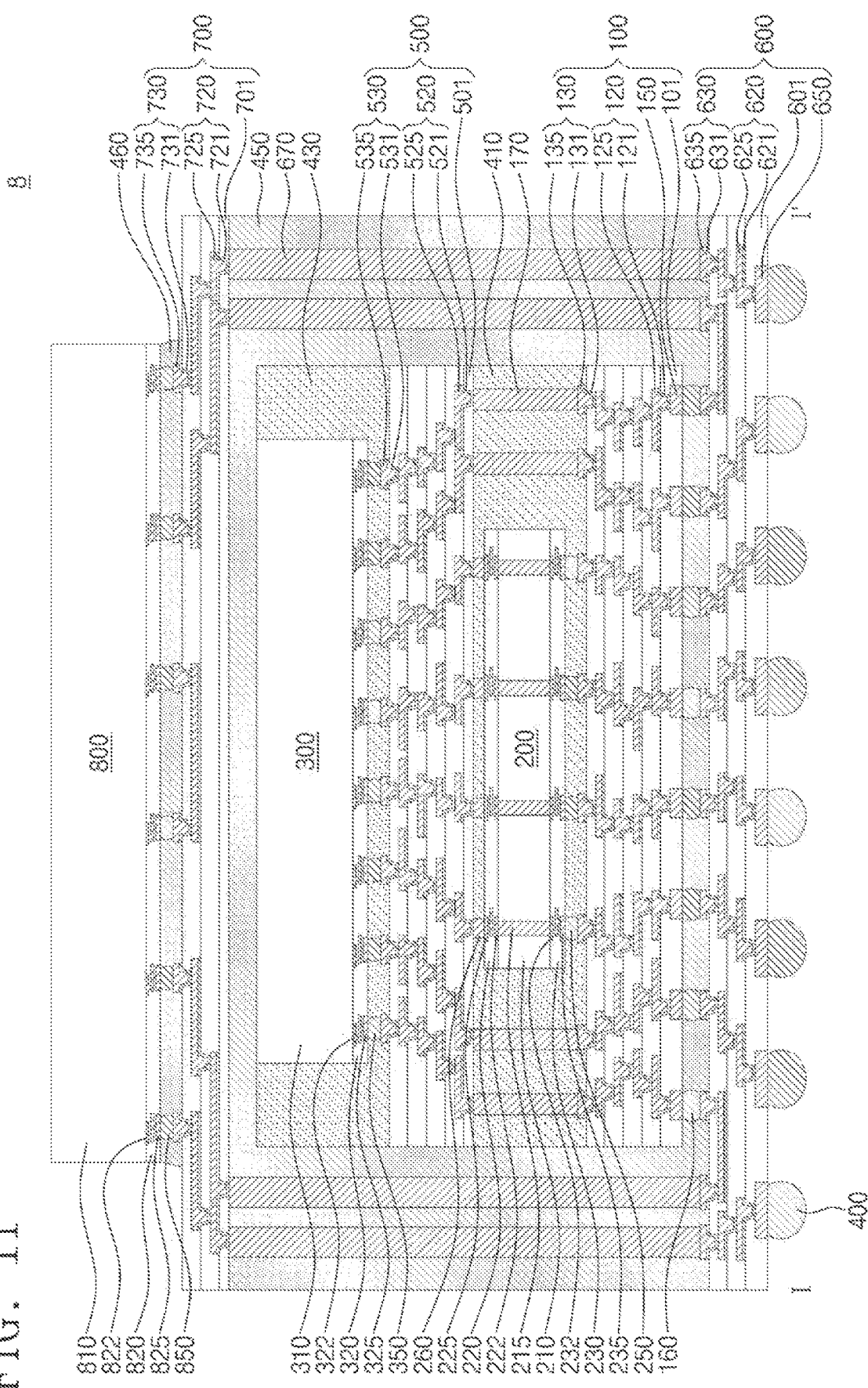
FIG. 11 is a sectional view, which is taken along the line I-I' of FIG. 9 to illustrate a semiconductor package according to an embodiment.

FIG. 11 is a sectional view, which is taken along the line I-I' of FIG. 9 to illustrate a semiconductor package according to an embodiment. For concise description, a previously described element may be identified by the same reference number without repeating duplicate descriptions thereof.

Referring to FIGS. 9 and 11, a semiconductor package 8 may include the first substrate 600, the second substrate 700, the lower semiconductor package, and the third semiconductor chip 800. The lower semiconductor package may include the first redistribution substrate 100, the second redistribution substrate 500, the first semiconductor chip 200, and the second semiconductor chip 300. However, the lower semiconductor package may not include the under-fill layer 420 previously described with reference to FIG. 2.

The second mold layer 430 may be provided on the second redistribution substrate 500. The second mold layer 430 may be disposed on the side surfaces of the second semiconductor chip 300, and may expose the top surface of the second semiconductor chip 300. The second mold layer 430 may be extended into a region between the second redistribution substrate 500 and the second semiconductor chip 300. The second mold layer 430 may be provided to fill a space between the third bumps 350 and to seal or encapsulate the third humps 350.

FIGS. 12 to 24 are sectional views illustrating a method of fabricating a semiconductor package according to an embodiment. For concise description, a previously described element may be identified by the same reference number without repeating duplicate descriptions thereof.

Figure 12:
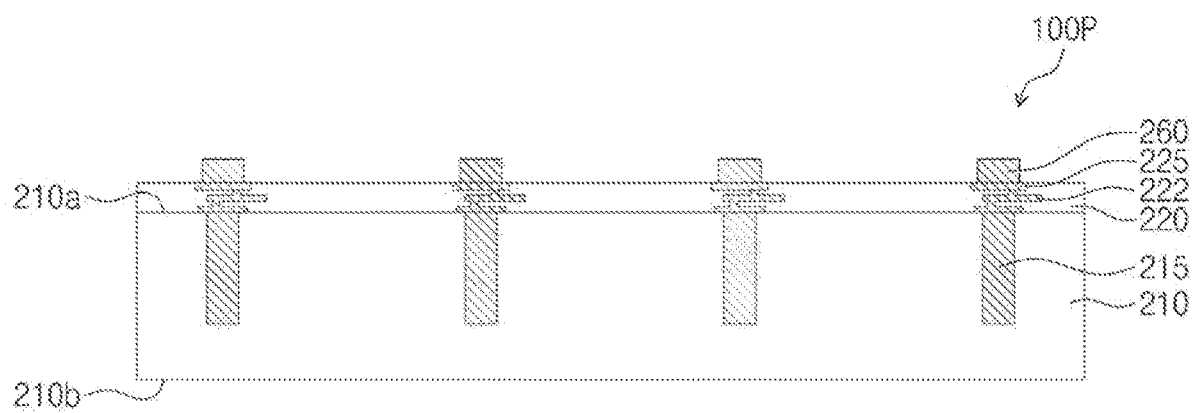
FIGS. 12, 13, 14, 15, 16, 17, 18, 19, 20, 21, 22, 23, and 24 are sectional views illustrating a method of fabricating a semiconductor package according to an embodiment.

Referring to FIG. 12, a preliminary semiconductor chip 100P including the first chip substrate 210 and the penetration vias 215 may be fabricated. The first chip substrate 210 may include a first surface 210a and a second surface 210b, which are opposite to each other. The penetration vias 215 may be provided in the first chip substrate 210. The penetration vias 215 may be exposed to the outside of the first chip substrate 210 near the first surface 210a of the first chip substrate 210. The first upper interconnection layer 220, the first upper interconnection structures 222, and the first upper pads 225 may be formed on the first surface 210a of the first chip substrate 210. The second bumps 260 may be formed on the first upper pads 225. For convenience of explanation, one preliminary semiconductor chip 100P will be described below, but the fabrication process according to an embodiment is not limited to a chip-level fabrication process. As an example, the preliminary semiconductor chip 100P may be fabricated by a wafer- or panel-level fabrication process.

Figure 13:
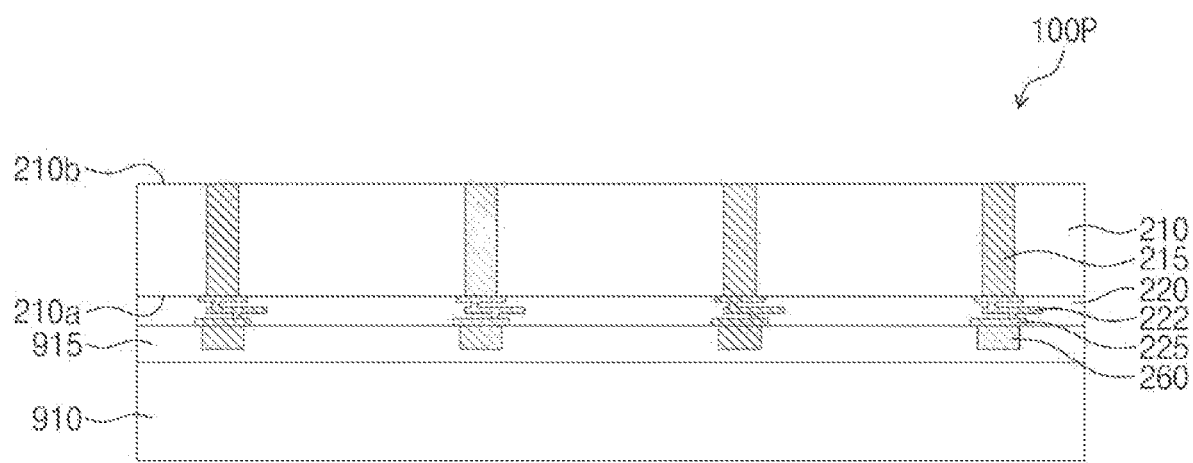

Referring to FIG. 13, a first carrier substrate 910 may be provided. A polymer layer 915 may be formed on the first carrier substrate 910. The first chip substrate 210 may be inverted such that the second surface 210b is oriented in an upward direction, and then, the preliminary semiconductor chip 100P may be disposed on the first carrier substrate 910. The polymer layer 915 may be disposed on the second bumps 260. The preliminary semiconductor chip 100P may be attached to the first carrier substrate 910 by the polymer layer 915.

A thinning process may be performed on the first chip substrate 210. The first chip substrate 210 may be partially removed by the thinning process. The thinning process may include a grinding process or an etch-back process. After the thinning process, the top surface of the first chip substrate 210 may be disposed at substantially the same level as the top surfaces of the penetration vias 215.

Figure 14:
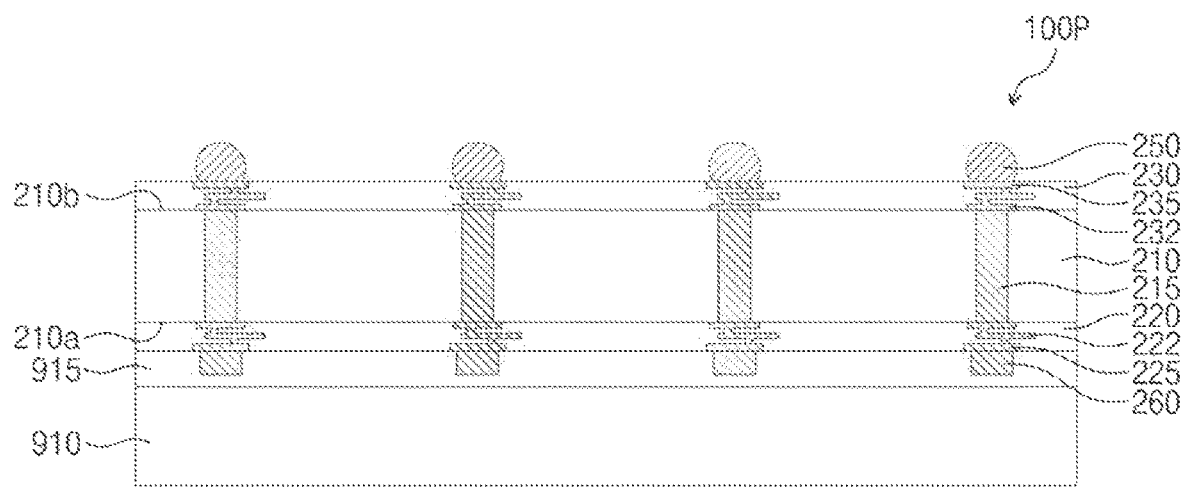

Referring to FIG. 14, the first lower interconnection layer 230, the first lower interconnection structures 232, and the first lower pads 235 may be formed on the second surface 210b of the first chip substrate 210. The first bumps 250 may be formed on the first lower pads 235.

Figure 15:
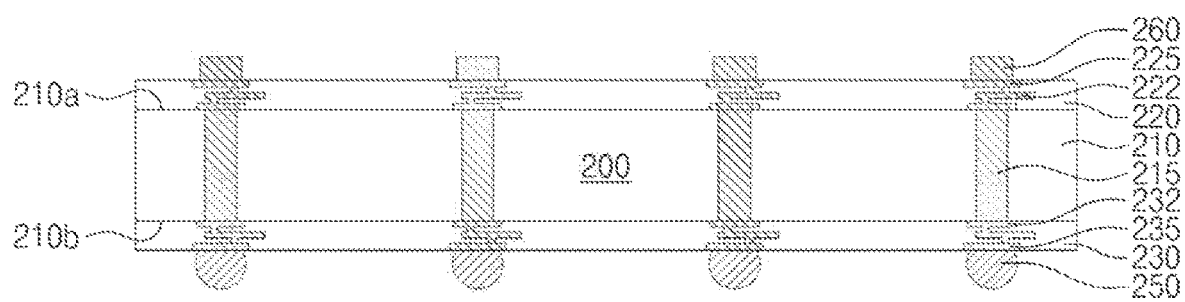

Referring to FIG. 15, the structure of FIG. 14 may be inverted such that the first surface 210a of the first chip substrate 210 is oriented in an upward direction. The first carrier substrate 910 and the polymer layer 915 may be removed to expose the second bumps 260. A sawing process may be performed on the preliminary semiconductor chip 100P. As a result of the afore-described processes, the first semiconductor chip 200 may be fabricated.

Figure 16:
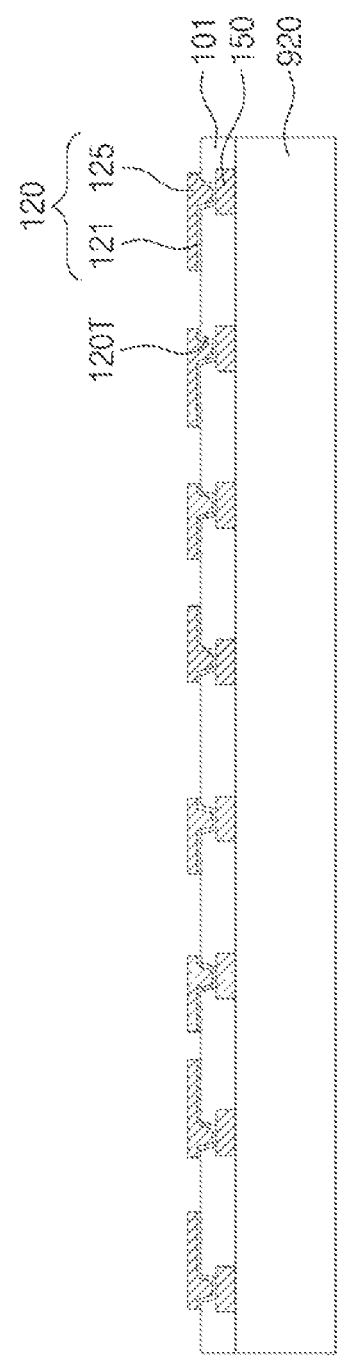

Referring to FIG. 16, a second carrier substrate 920 may be provided. For example, the second carrier substrate 920 may include a glass substrate. The first under-bump patterns 150 may be formed on the second carrier substrate 920. The first under-bump patterns 150 may be formed by, for example, an electroplating process. The first insulating layer 101 may be formed on the second carrier substrate 920. Openings 120T may be formed in the first insulating layer 101 to expose the first under-bump patterns 150.

The first redistribution patterns 120 may be formed. The formation of the first redistribution patterns 120 may include forming the first seed patterns 121 and the first conductive patterns 125. The formation of the first seed patterns 121 and the first conductive patterns 125 may include forming a first seed layer in the openings 120T and on the top surface of the first insulating layer 101, forming a resist pattern on the first seed layer, performing an electroplating process using the first seed layer as an electrode to form the first conductive patterns 125, removing the resist pattern, and performing an etching process to remove an exposed portion of the first seed layer. As a result of the electroplating process, each of the first conductive patterns 125 may include a first via portion, which is formed in the opening 120T, and a first wire portion, which is formed on the first insulating layer 101. The first seed patterns 121 may be formed by the etching process. The resist pattern may be removed by, for example, a strip process.

Figure 17:
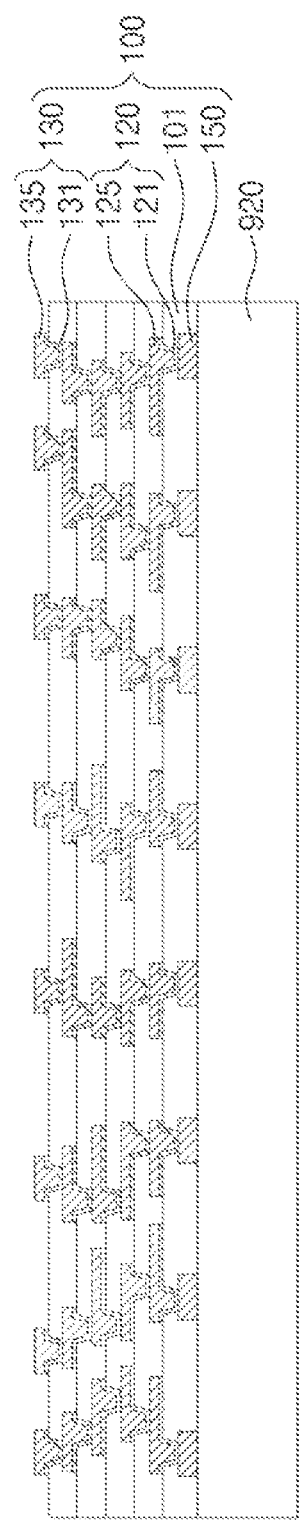

Referring to FIG. 17, the first insulating layers 101 and the first redistribution patterns 120 may be additionally stacked on the structure of FIG. 16. For example, the process of forming the first insulating layer 101 and the first redistribution pattern 120, described with reference to FIG. 16, may be repeated. The first pad structures 130 may be formed on the uppermost ones of the first redistribution patterns 120.

The formation of the first pad structures 130 may include forming the first seed pads 131 and the first pad patterns 135. The first seed pads 131 may be formed by the same method as that for the first seed patterns 121 described with reference to FIG. 16. The first pad patterns 135 may be formed by the same method as that for the first conductive patterns 125 described with reference to FIG. 16. Accordingly, the first redistribution substrate 100 may be formed.

Figure 18:
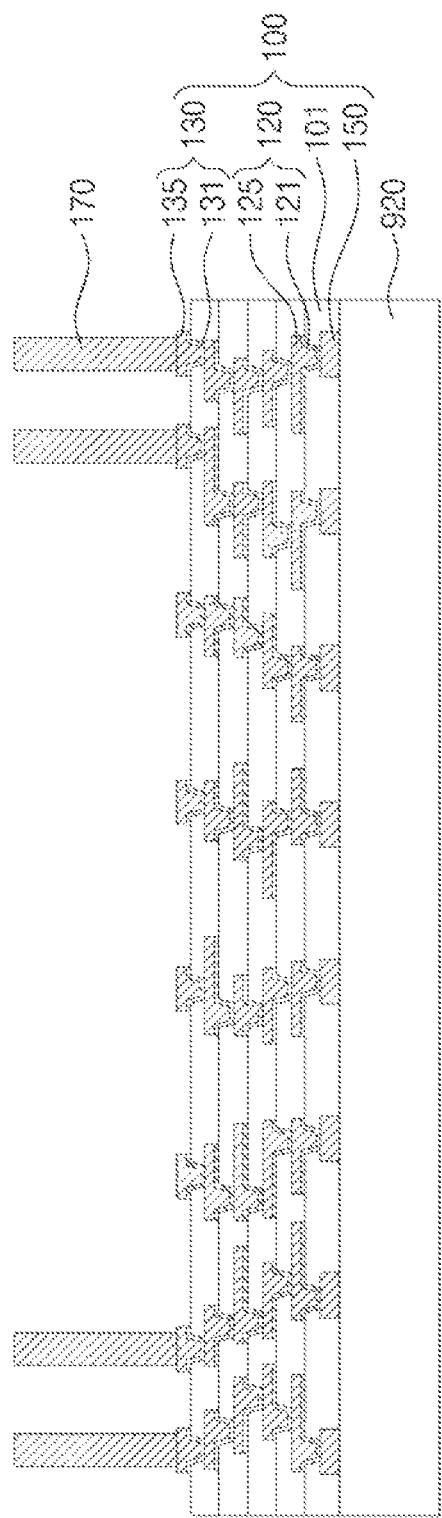

Referring to FIG. 18, the first conductive structures 170 may be formed on the first redistribution substrate 100. The first conductive structures 170 may be formed on the edge region of the first redistribution substrate 100, in a plan view. Each of the first conductive structures 170 may be formed on a corresponding one of the first pad structures 130. In an embodiment, the first conductive structures 170 may be formed by an electroplating process.

Figure 19:
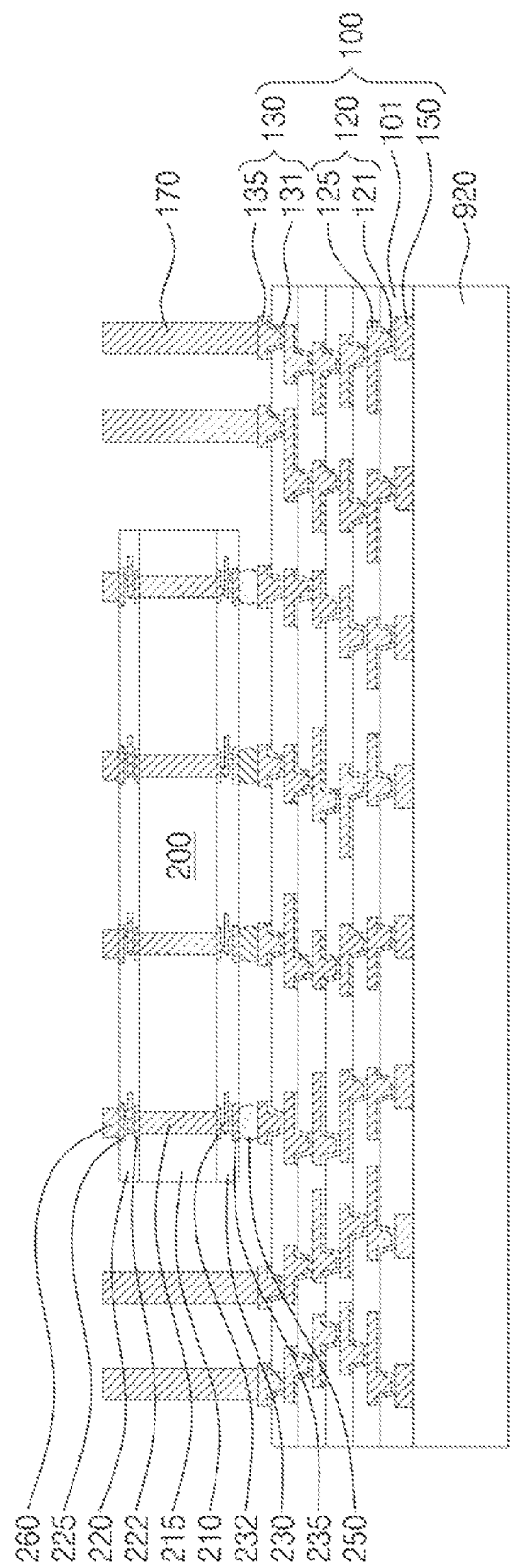

Referring to FIG. 19, the first semiconductor chip 200 fabricated in the previous step may be mounted on the first redistribution substrate 100. The mounting of the first semiconductor chip 200 may include forming the first bumps 250 between the first redistribution substrate 100 and the first semiconductor chip 200. The first bumps 250 may be formed between the first pad structures 130 and the first lower pads 235.

Figure 20:
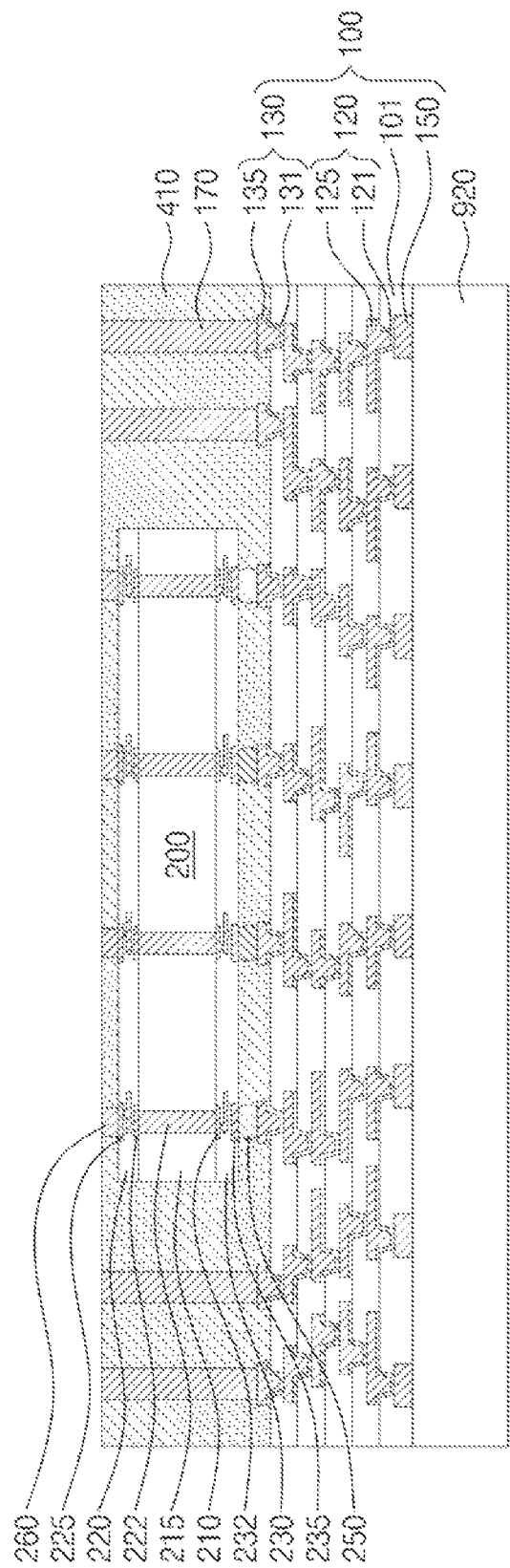

Referring to FIG. 20, the first mold layer 410 may be formed on the first redistribution substrate 100 to be disposed on the first semiconductor chip 200 and the first conductive structures 170. A grinding process may be performed on the first mold layer 410 to remove a portion of the first mold layer 410. In an embodiment, the grinding process may be performed to expose top surfaces of the first conductive structures 170 and top surfaces of the second bumps 260. The top surfaces of the first conductive structures 170 and the top surfaces of the second bumps 260 may be disposed at substantially the same level as a top surface of the first mold layer 410.

Figure 21:
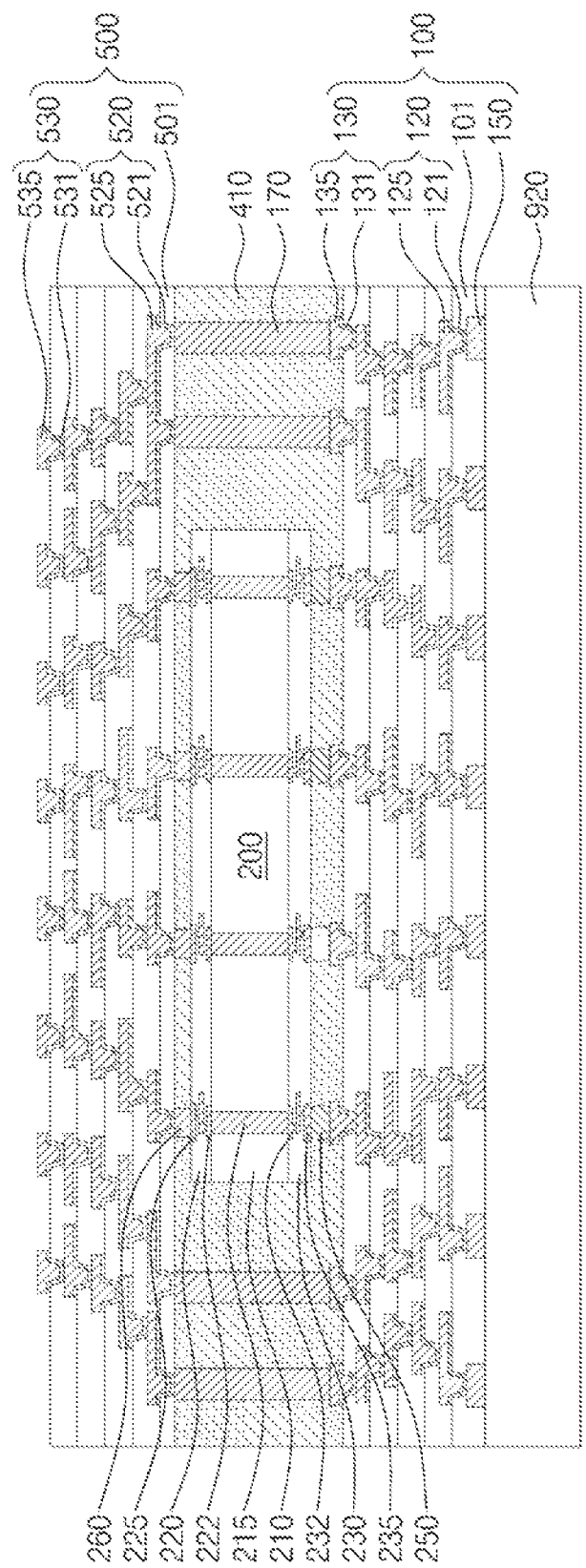

Referring to FIG. 21, the second insulating layer 501 and the second redistribution patterns 520 may be formed on the first mold layer 410. The formation of the second redistribution patterns 520 may include forming the second seed patterns 521 and the second conductive patterns 525. The second seed patterns 521 may be formed by the same method as that for the first seed patterns 121 described with reference to FIG. 16. The second conductive patterns 525 may be formed by the same method as that for the first conductive patterns 125 described with reference to FIG. 16. This process may be repeated to form the second insulating layers 501 and the second redistribution patterns 520 which are vertically stacked.

The second pad structures 530 may be formed on the uppermost ones of the second redistribution patterns 520. The formation of the second pad structures 530 may include forming the second seed pads 531 and the second pad patterns 535. The second seed pads 531 may be formed by the same method as that for the first seed patterns 121 described with reference to FIG. 16. The second pad patterns 535 may be formed by the same method as that for the first conductive patterns 125 described with reference to FIG. 16. Accordingly, the second redistribution substrate 500 may be formed.

Figure 22:
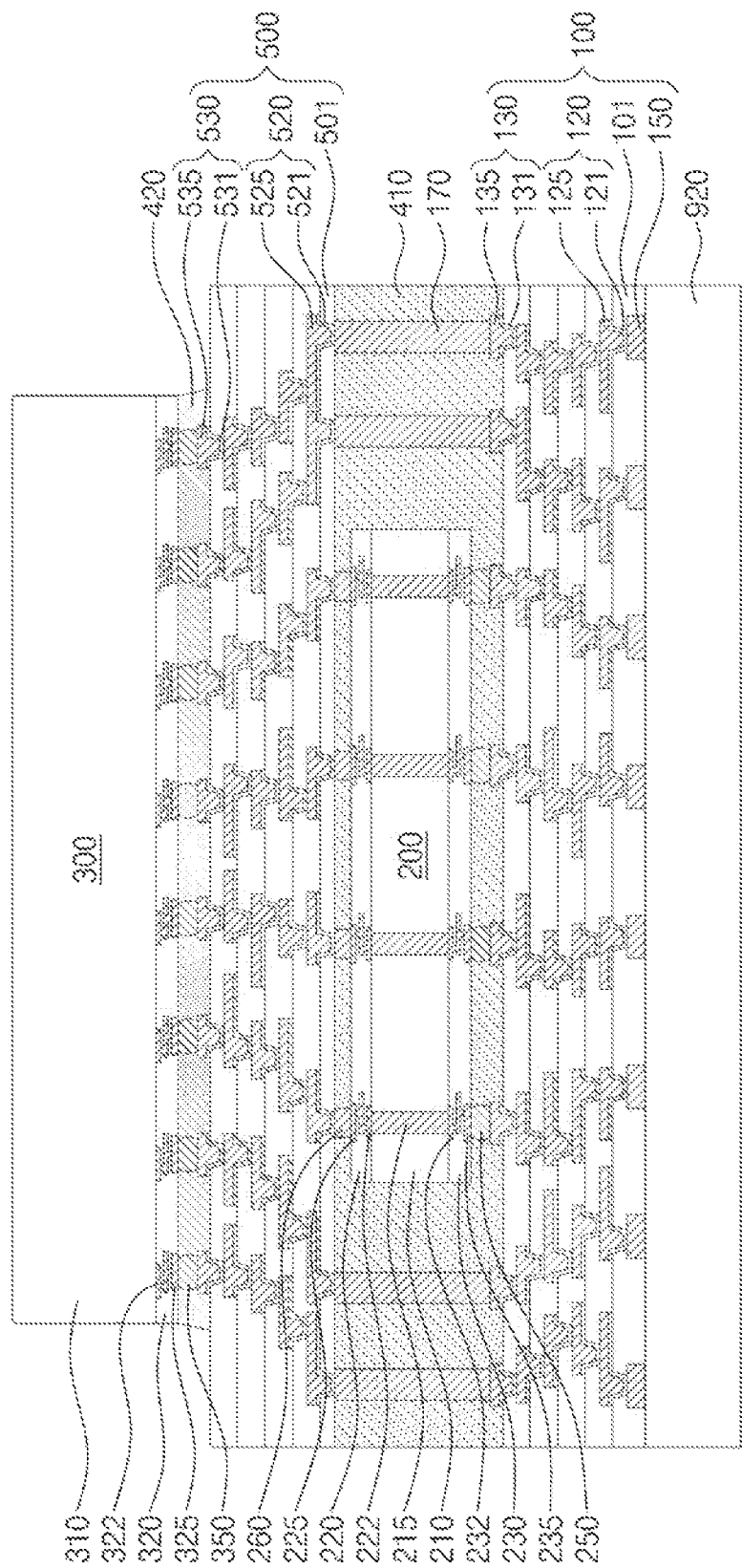

Referring to FIG. 22, the second semiconductor chip 300 may be mounted on the second redistribution substrate 500. The mounting of the second semiconductor chip 300 may include forming the third bumps 350 between the second redistribution substrate 500 and the second semiconductor chip 300. The third bumps 350 may be formed between the second pad structures 530 and the second pads 325.

The under-fill layer 420 may be formed between the second redistribution substrate 500 and the second semiconductor chip 300. The under-fill layer 420 may be formed to fill a space between the third bumps 350.

In the case where the second semiconductor chip 300 is mounted in a related chip-on-wafer (COW) manner, the second semiconductor chip 300 may be also mounted as a part of the semiconductor package. However, if the second semiconductor chip 300 fails, this may cause a reduction of production yield in a process of fabricating a semiconductor package.

By contrast, according to an embodiment, normal (i.e., non-failed) chips may be sorted from the second semiconductor chips 300 and then may be independently mounted on the second redistribution substrate 500. This may make it possible to increase a production yield of a semiconductor package and to reduce production cost for fabricating the semiconductor package.

Figure 23:
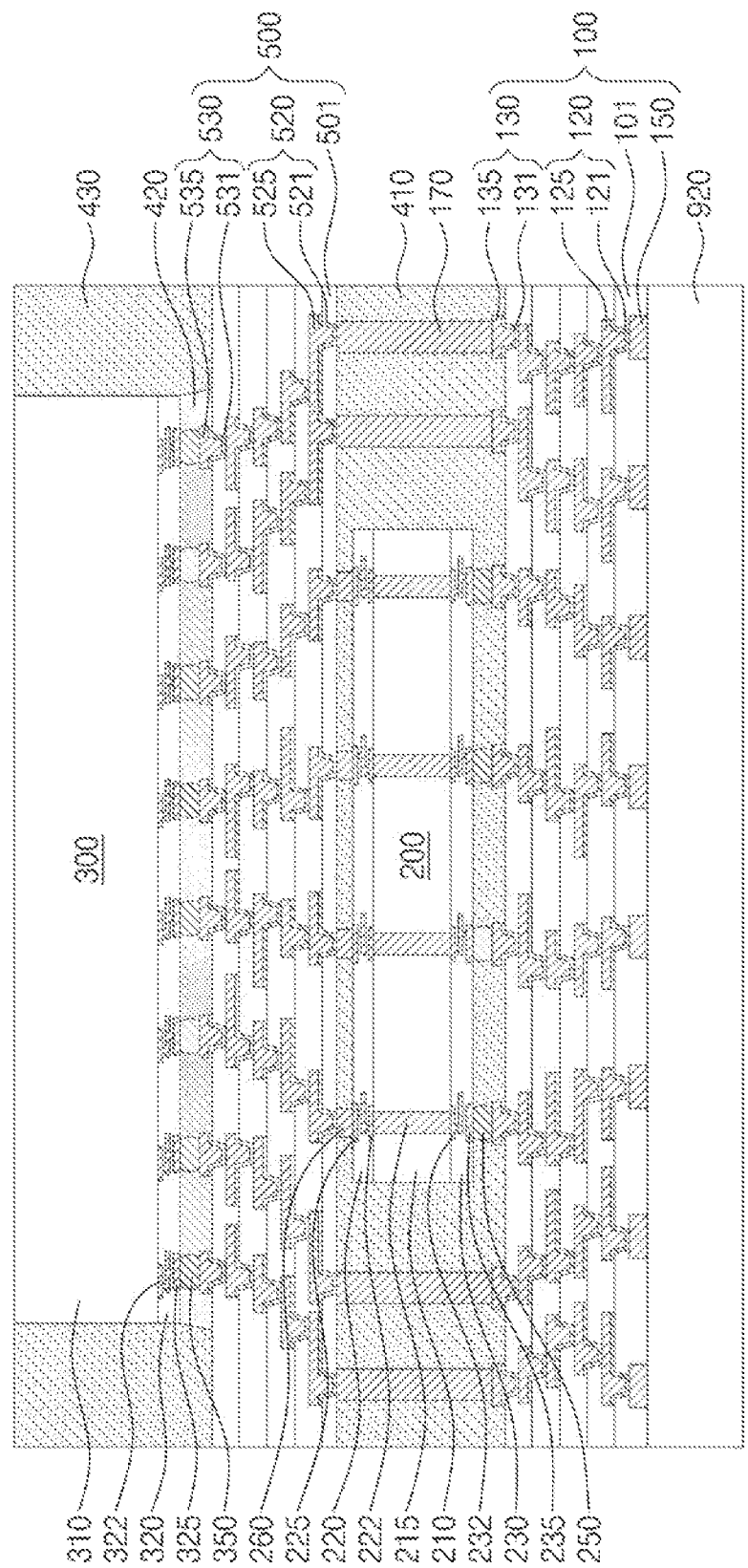

Referring to FIG. 23, the second mold layer 430 may be formed on the second redistribution substrate 50M to be disposed on the second semiconductor chip 300. A grinding process may be performed on the second mold layer 430 to remove a portion of the second mold layer 430. In an embodiment, the top surface of the second semiconductor chip 300 may be exposed to the outside by the grinding process.

Figure 24:
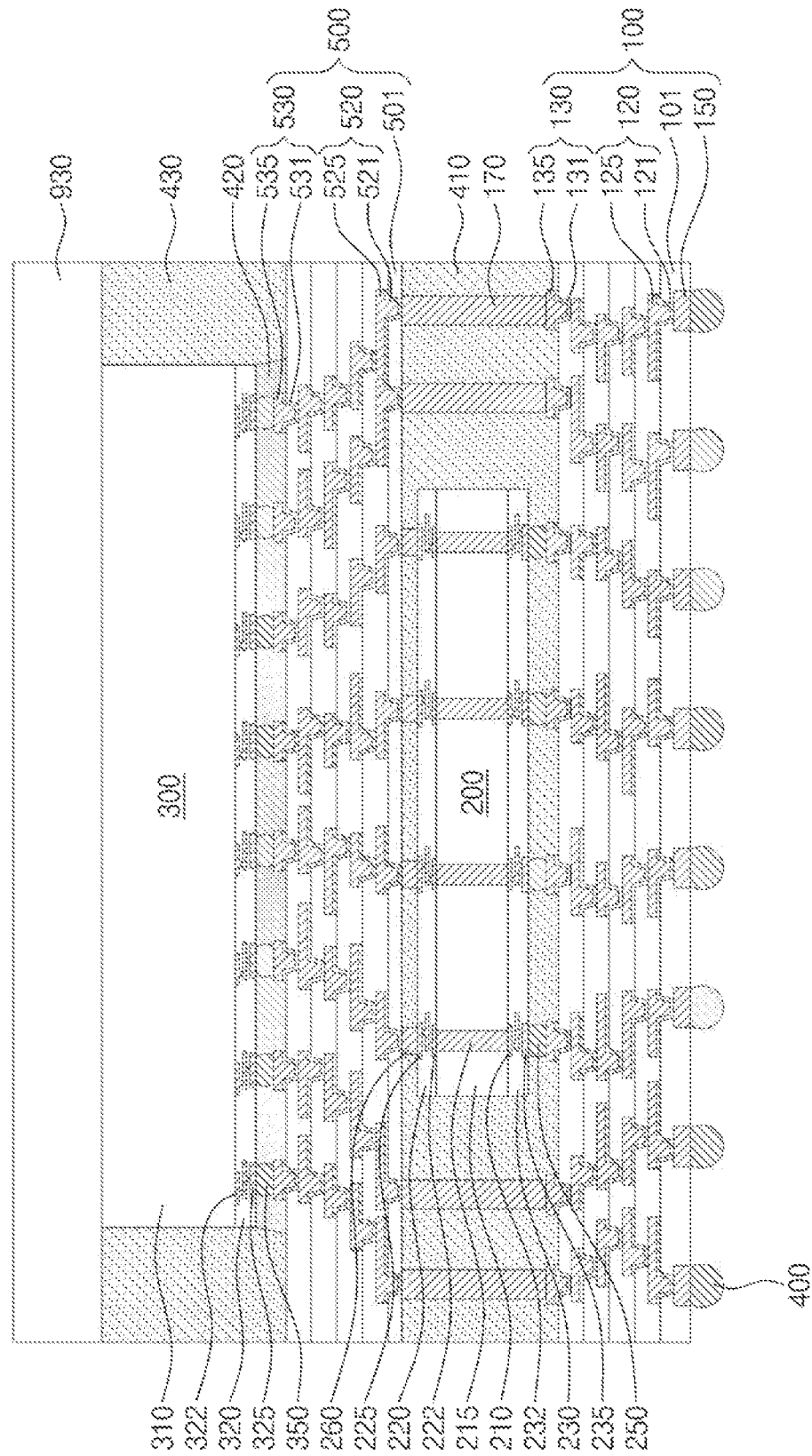

Referring to FIG. 24, the second carrier substrate 920 may be removed. A third carrier substrate 930 may be formed on the second semiconductor chip 300 and the second mold layer 430. The third carrier substrate 930 may include, for example, a glass substrate. The outer terminals 400 may be formed on bottom surfaces of the first under-bump patterns 150. The formation of the outer terminals 400 may include performing a solder ball attaching process.

Referring back to FIGS. 1 and 2, the third carrier substrate 930 may be removed. As a result, the semiconductor package 1 according to an embodiment may be formed.

According to an embodiment, a first semiconductor chip may be disposed at a lower level, and a second semiconductor chip may be disposed at an upper level. Accordingly, the first and second semiconductor chips may be packaged in a relatively high density. As a result, it may be possible to realize a semiconductor package with a relatively high package density or a small size.

According to an embodiment, semiconductor chips, which can be normally operated, may be first sorted, and then, the semiconductor chips may be individually mounted on a redistribution substrate. This may make it possible to increase a production yield of a semiconductor package and to reduce production cost for fabricating the semiconductor package.

While example embodiments have been described with reference to the figures, it will be understood by those of ordinary skill in the art that various changes in form and details may be made therein without departing from the spirit and scope as defined by the following claims and their equivalents.

What is claimed is:

1. A semiconductor package, comprising:
a first substrate;
a first redistribution substrate on the first substrate;
a first semiconductor chip on the first redistribution substrate;
first bumps between the first redistribution substrate and the first semiconductor chip;
a conductive structure, on the first redistribution substrate, spaced apart from the first semiconductor chip;
a second redistribution substrate on the first semiconductor chip;
second bumps between the first semiconductor chip and the second redistribution substrate;
a second semiconductor chip on the second redistribution substrate;
a second conductive structure on the first substrate and adjacent to the first redistribution substrate in a horizontal direction;
a first mold layer between the first redistribution substrate and the second redistribution substrate, and on the first semiconductor chip; and
a second mold layer, on the second redistribution substrate and the second semiconductor chip, spaced apart from the first mold layer.

2. The semiconductor package of claim 1, wherein the first redistribution substrate comprises a first insulating layer and a first redistribution pattern in the first insulating layer, wherein the first redistribution pattern comprises a first seed pattern and a first conductive pattern that is on the first seed pattern,
wherein the second redistribution substrate comprises a second insulating layer and a second redistribution pattern that is in the second insulating layer, and
wherein the second redistribution pattern comprises a second seed pattern and a second conductive pattern that is on the second seed pattern.

3. The semiconductor package of claim 1, wherein a width of the first semiconductor chip is smaller than a width of the second semiconductor chip.

4. The semiconductor package of claim 1, wherein the first mold layer fills a space between the first bumps, and
wherein the first mold layer fills a space between the second bumps.

5. The semiconductor package of claim 1, wherein each of the first bumps comprises a solder ball or a solder bump, and
wherein each of the second bumps comprises a pillar.

6. The semiconductor package of claim 1, further comprising:
third bumps between the second redistribution substrate and the second semiconductor chip; and
an under-fill layer, between the second redistribution substrate and the second semiconductor chip, filling a space between the third bumps.

7. The semiconductor package of claim 1, further comprising third bumps between the second redistribution substrate and the second semiconductor chip,
wherein the second mold layer fills a space between the third bumps.

8. The semiconductor package of claim 1, wherein the first semiconductor chip comprises:
a first chip substrate;
a first upper interconnection layer on a top surface of the first chip substrate;
a first lower interconnection layer on a bottom surface of the first chip substrate; and
a penetration via penetrating the first chip substrate.

9. The semiconductor package of claim 1, wherein an area of a top surface of the first semiconductor chip is smaller than an area of a top surface of the second semiconductor chip.

10. The semiconductor package of claim 1, wherein the second mold layer exposes a top surface of the second semiconductor chip.

11. The semiconductor package of claim 1, wherein a level of a top surface of the second mold layer is higher than a level of a top surface of the second semiconductor chip.

12. A semiconductor package, comprising:
a first substrate;
a first redistribution substrate on the first substrate, the first redistribution substrate comprising a first insulating layer and a first redistribution pattern in the first insulating layer;
a first semiconductor chip on the first redistribution substrate;
a first conductive structure, on the first redistribution substrate, spaced apart from the first semiconductor chip;
a second redistribution substrate on the first semiconductor chip, the second redistribution substrate comprising a second insulating layer and a second redistribution pattern that is in the second insulating layer;
a second semiconductor chip on the second redistribution substrate; and a second conductive structure on the first substrate and spaced apart from the first redistribution substrate in a horizontal direction, wherein the first redistribution pattern comprises a first seed pattern and a first conductive pattern that is on the first seed pattern.

13. The semiconductor package of claim 12, further comprising:

a first mold layer between the first redistribution substrate and the second redistribution substrate, and on the first semiconductor chip;

a second mold layer on the second redistribution substrate and the second semiconductor chip; and a third mold layer on the first substrate, the first mold layer, and the second mold layer.

14. The semiconductor package of claim 13, wherein the third mold layer is in direct contact with side surfaces of the first mold layer, and wherein the third mold layer is in direct contact with side surfaces of the second mold layer.

15. The semiconductor package of claim 12, wherein the second redistribution pattern comprises a second seed pattern and a second conductive pattern that is on the second seed pattern.

16. The semiconductor package of claim 15, wherein the first substrate comprises a third insulating layer and a third redistribution pattern in the third insulating layer, and wherein the third redistribution pattern comprises a third seed pattern and a third conductive pattern that is on the third seed pattern.

17. The semiconductor package of claim 16, further comprising a second substrate on the second semiconductor chip, wherein the second substrate comprises a fourth insulating layer and a fourth redistribution pattern that is in the fourth insulating layer, and wherein the fourth redistribution pattern comprises a fourth seed pattern and a fourth conductive pattern that is on the fourth seed pattern.

18. A semiconductor package, comprising:
a first substrate;
a first redistribution substrate on the first substrate;
a first semiconductor chip on the first redistribution substrate;
a first conductive structure, on the first redistribution substrate, spaced apart from the first semiconductor chip;
a second redistribution substrate on the first semiconductor chip;
a second semiconductor chip on the second redistribution substrate;
a second conductive structure, on the first substrate, spaced apart from the first redistribution substrate in a horizontal direction;
a second substrate on the second semiconductor chip; and
a first mold layer between the first redistribution substrate and the second redistribution substrate, and on the first semiconductor chip, wherein the first mold layer is between the first redistribution substrate and the first semiconductor chip and between the first semiconductor chip and the second redistribution substrate, and wherein the second conductive structure contacts the first substrate and the second substrate.

19. The semiconductor package of claim 18, further comprising a third semiconductor chip on the second substrate, wherein the third semiconductor chip comprises a semiconductor chip that is different from the first semiconductor chip and the second semiconductor chip.

20. The semiconductor package of claim 18, further comprising:

a second mold layer on the second redistribution substrate and the second semiconductor chip; and a third mold layer on the first substrate and the second conductive structure, wherein a level of a top surface of the second mold layer is the same as a level of a top surface of the second semiconductor chip, and wherein the third mold layer is between the second semiconductor chip and the second substrate.

* * * * *